(12) United States Patent
Dai et al.

(10) Patent No.: US 12,525,176 B2
(45) Date of Patent: *Jan. 13, 2026

(54) DISPLAY PANEL AND DISPLAY DEVICE

(71) Applicant: Hubei Yangtze Industrial Innovation Center Of Advanced Display Co., Ltd., Wuhan (CN)

(72) Inventors: Wenjun Dai, Shanghai (CN); Liang Xing, I, Shanghai (CN); Tianyi Wu, Shanghai (CN)

(73) Assignee: Hubei Yangtze Industrial Innovation Center Of Advanced Display Co., Ltd., Wuhan (CN)

( * ) Notice: Subject to any disclaimer, the term of this patent is extended or adjusted under 35 U.S.C. 154(b) by 0 days.

This patent is subject to a terminal disclaimer.

(21) Appl. No.: 18/735,083

(22) Filed: Jun. 5, 2024

(65) Prior Publication Data
US 2024/0321188 A1 Sep. 26, 2024

Related U.S. Application Data

(63) Continuation of application No. 17/968,266, filed on Oct. 18, 2022, now Pat. No. 12,014,672, which is a (Continued)

(30) Foreign Application Priority Data

May 6, 2021 (CN) .......................... 202110490929.7

(51) Int. Cl.
*G09G 3/32* (2016.01)
*G02F 1/1362* (2006.01)

(52) U.S. Cl.
CPC ......... *G09G 3/32* (2013.01); *G02F 1/136204* (2013.01); *G09G 2300/0408* (2013.01);
(Continued)

(58) Field of Classification Search
CPC ................. H10K 59/00–95; G09G 2310/0297
See application file for complete search history.

(56) References Cited

U.S. PATENT DOCUMENTS

2009/0160847 A1 6/2009 Tanikame
2016/0217757 A1* 7/2016 Tanaka .............. G02F 1/133514
(Continued)

FOREIGN PATENT DOCUMENTS

| CN | 105139806 A | 12/2015 |
|---|---|---|
| CN | 106023944 A | 10/2016 |

(Continued)

*Primary Examiner* — Sanjiv D. Patel
(74) *Attorney, Agent, or Firm* — KDW FIRM PLLC

(57) ABSTRACT

Disclosed are a display panel and a display device. The display panel includes a display area, a plurality of light-emitting elements located in the display area, and at least one driver circuit located in the display area; the plurality of light-emitting elements includes a plurality of light-emitting element rows extend in a first direction and arranged in a second direction, where the first direction and the second direction intersect; the at least one driver circuit includes a plurality of shift register circuits disposed in cascade and a shift register circuit of the plurality of shift register circuits is located between adjacent light-emitting element rows of the plurality of light-emitting element rows.

20 Claims, 23 Drawing Sheets

Related U.S. Application Data continuation of application No. 17/445,182, filed on Aug. 16, 2021, now Pat. No. 11,514,845.

(52) U.S. Cl.
CPC ............... *G09G 2300/0426* (2013.01); *G09G 2310/0267* (2013.01); *G09G 2310/0286* (2013.01); *G09G 2310/0291* (2013.01)

(56) References Cited

U.S. PATENT DOCUMENTS

| | | |
|---|---|---|
| 2016/0267831 A1 | 9/2016 | Seo |
| 2018/0075923 A1 | 3/2018 | Ma |
| 2018/0138256 A1* | 5/2018 | Han .................... G09G 3/20 |
| 2020/0091445 A1 | 3/2020 | Kwon |
| 2020/0159054 A1 | 5/2020 | Jeong |
| 2020/0402475 A1 | 12/2020 | Li |
| 2021/0057659 A1 | 2/2021 | Sun |
| 2021/0104192 A1* | 4/2021 | Huang .................... G09G 3/20 |
| 2021/0118373 A1 | 4/2021 | Chen |
| 2021/0397286 A1 | 12/2021 | Zhai |
| 2024/0054952 A1 | 2/2024 | Sun |

FOREIGN PATENT DOCUMENTS

| | | |
|---|---|---|
| CN | 107045850 A | 8/2017 |
| CN | 107993613 A | 5/2018 |
| CN | 110265454 A | 9/2019 |
| CN | 111430415 A | 7/2020 |

\* cited by examiner

DISPLAY PANEL AND DISPLAY DEVICE

CROSS-REFERENCE TO RELATED APPLICATION

This is a continuation of U.S. patent application Ser. No. 17/968,266, filed Oct. 18, 2022, which is a continuation of U.S. patent application Ser. No. 17/445,182, filed Aug. 16, 2021, which claims priority to Chinese Patent Application No. 202110490929.7 filed May 6, 2021, the disclosures of which are incorporated herein by reference in their entireties.

TECHNICAL FIELD

Embodiments of the present disclosure relate to display technologies, and in particular, to a display panel and a display device.

BACKGROUND

A light-emitting diode (LED) display panel, such as a micro-LED display panel and a mini-LED display panel, has advantages of self-emitting, low drive voltage, high light-emitting efficiency, short response time, high definition and contrast ratio and the like.

In the related art, a driver circuit is prepared on a left frame and/or a right frame of the display panel, so that pixels are driven line by line so as to emit light, and complete the display of a picture. However, a scheme that the driver circuit is located on the left frame and the right frame does not conform to the development trend of a narrow frame of the display panel.

SUMMARY

Embodiments of the present disclosure provide a display panel and a display device, so as to reduce a width of a frame of the display panel and achieve a narrow frame or even no frame.

In a first aspect, an embodiment of the present disclosure provides a display panel. The display panel includes a display area. The display panel further comprises: a light-emitting element, wherein the light-emitting element is located in the display area; a pixel circuit, wherein the pixel circuit is located in the display area and the pixel circuit is configured to drive the light-emitting element; a driver circuit, wherein the driver circuit is located in the display area and the driver circuit is configured to provide a drive signal to the pixel circuit; and pixel circuit rows, wherein at least one of the pixel circuit rows comprises a plurality of pixel circuits arranged along a first direction, the pixel circuit rows are arranged along a second direction, the first direction and the second direction intersect; wherein the driver circuit comprises a plurality of stages of shift register circuits cascaded and at least one stage of shift register circuit is located between adjacent pixel circuit rows; the display panel further comprises a multiplexing circuit disposed in the display area; and/or the display panel further comprises a signal terminal disposed in the display area; and/or the display panel further comprises an electrostatic protection circuit disposed in the display area.

In a second aspect, an embodiment of the present disclosure further provides a display device, including the display panel provided in the first aspect.

DETAILED DESCRIPTION

Figure 1:
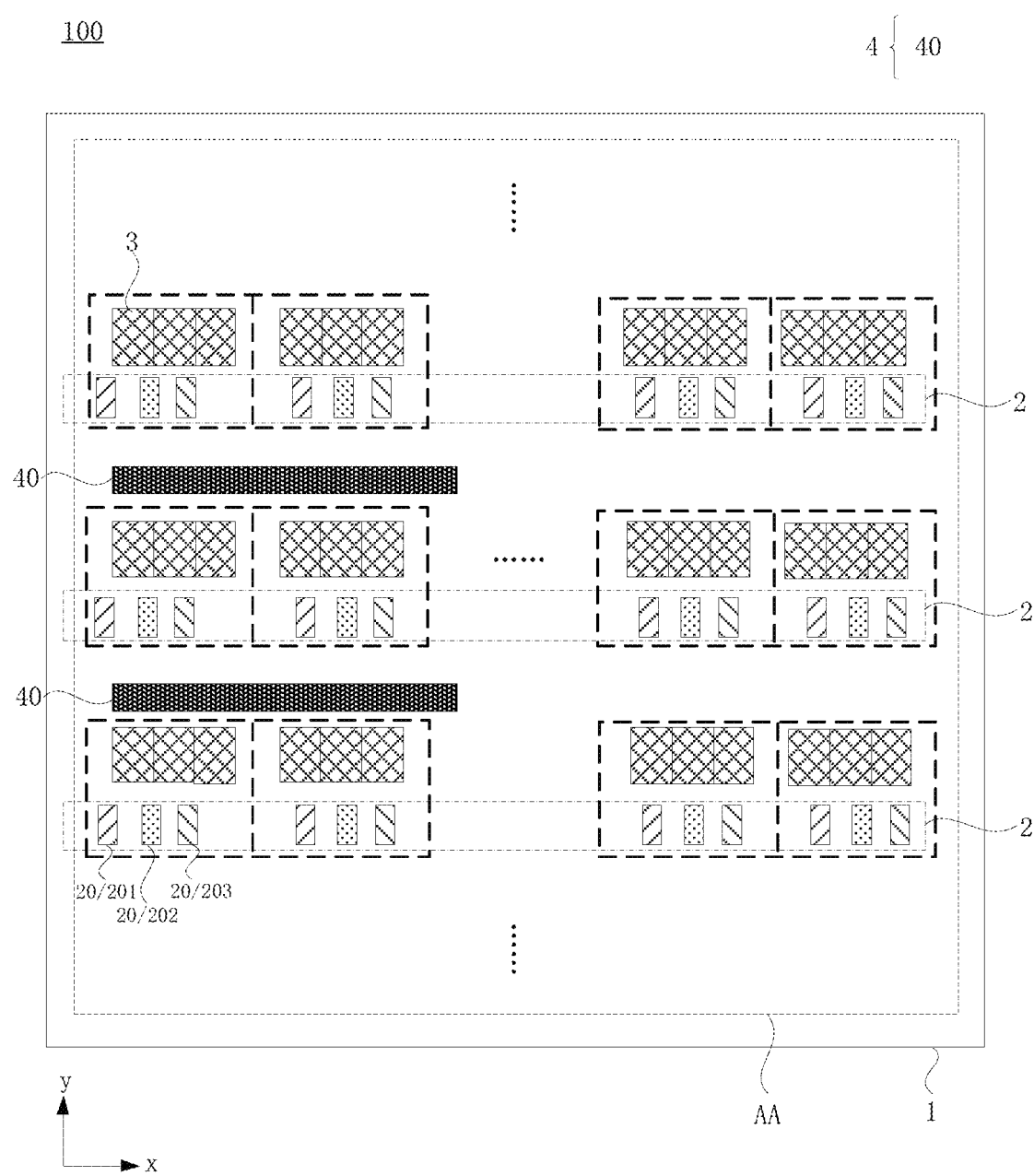
FIG. 1 is a schematic structural diagram of a display panel provided in an embodiment of the present disclosure.

The present disclosure will be further described in detail in conjunction with the drawings and embodiments below. It should be understood that the specific embodiments described herein are merely used for explaining the present disclosure and are not intended to limit the present disclosure. It should also be noted that, for ease of description, only some, but not all, of the structures related to the present disclosure are shown in the drawings, and that the shapes and sizes of various elements in the drawings do not reflect their true scale, and are intended to be illustrative of the present disclosure.

Figure 2:
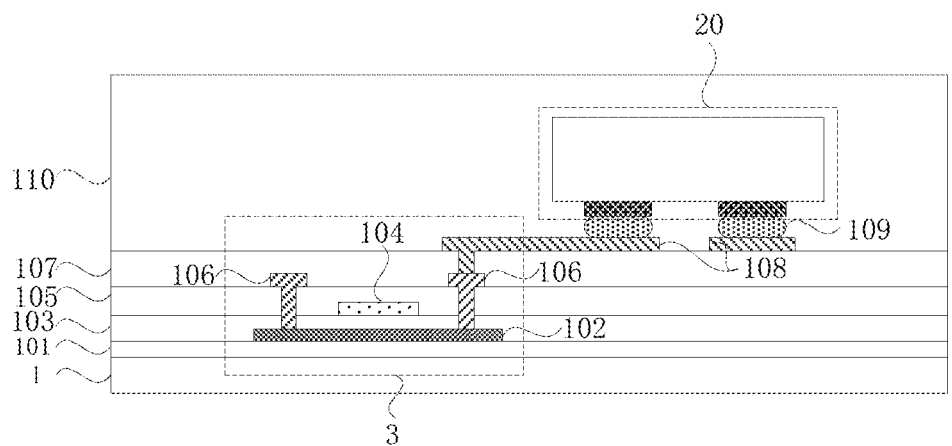
FIG. 2 is a schematic diagram of a partial cross-sectional structure of a display panel provided in an embodiment of the present disclosure.
Figure 3:
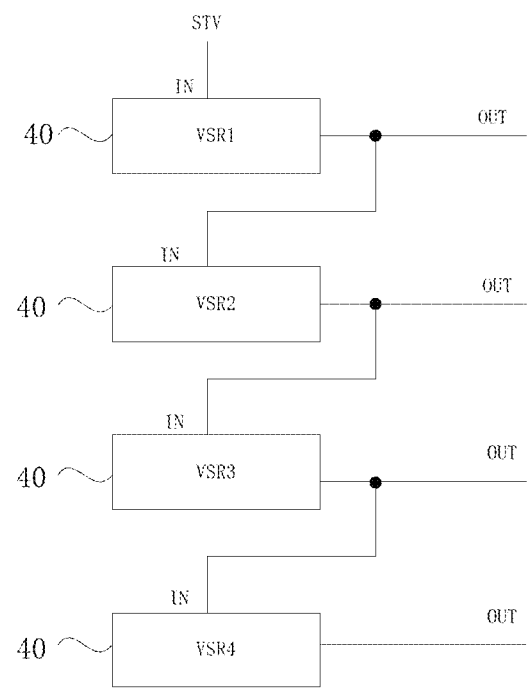
FIG. 3 is a schematic structural diagram of a driver circuit.

FIG. 1 is a schematic structural diagram of a display panel provided in an embodiment of the present disclosure. FIG. 2 is a schematic diagram of a partial cross-sectional structure of a display panel provided in an embodiment of the present disclosure. FIG. 3 is a schematic structural diagram of a driver circuit. Referring to FIGS. 1 to 3 concurrently, the display panel 100 includes a display area AA; a base substrate 1, multiple light-emitting elements 20, multiple pixel circuits 3 and at least one driver circuit 4. The multiple light-emitting elements 20, multiple pixel circuits 3 and driver circuit 4 are located on a side of the base substrate 1 and located in the display area AA. The driver circuit 4 is configured to transmit drive signals to the multiple pixel circuits 3, and the multiple pixel circuits 3 are configured to drive the multiple light-emitting elements 20; the multiple light-emitting elements 20 include multiple light-emitting element rows 2, each of the multiple light-emitting element rows 2 extends along a first direction x, and the multiple light-emitting element rows 2 are arranged along a second direction y, and the first direction x and the second direction y intersect, and each of the first direction x and the second direction y is parallel to a plane where the base substrate 1 is located. The driver circuit 4 includes multiple shift register circuits (VSRs, a number behind the VSR represents a number of stages where the shift register circuit is located) 40 disposed in cascade. The shift register circuit 40 is located between adjacent light-emitting element rows 2.

As shown in FIG. 1, the pixel circuit 3 generate a drive current in response to a drive signal of a corresponding shift register circuit 40 so as to drive a corresponding light-emitting element 20 to emit light, and since the multiple shift register circuits 40 are disposed in cascade (referring to FIG. 3, an output terminal OUT of a current-stage shift register circuit is electrically connected to an input terminal IN of a next-stage shift register circuit), the driver circuit 4 may scan the pixel circuits 3 line by line so as to achieve the display of one-frame picture. Further, the pixel circuits 3 may be in one-to-one correspondence with the light-emitting elements 20, or the pixel circuits 3 may correspond to multiple light-emitting elements 20, i.e., one pixel circuit 3 drives multiple light-emitting elements 20. A corresponding relationship between the pixel circuits 3 and the light-emitting elements 20 is not limited in the embodiments of the present disclosure, and FIG. 1 is illustrated by only using an example in which the pixel circuits 3 are in one-to-one correspondence with the light-emitting elements 20.

In the related art, the driver circuit is usually located on a left frame and/or a right frame (non-display area) of the display panel, the number of the driver circuits is relatively large, and the width of the frame is also relatively large, thus making a narrow frame difficult to achieve.

According to the embodiments of the present disclosure, the shift register circuit in the driver circuit is disposed between the adjacent light-emitting element rows, so that the driver circuit may be transferred from the non-display area to the display area, thus further reducing the width of the frame and making it relatively narrow.

It should be noted that FIG. 1 only shows that along the second direction y, the shift register circuit 40 is disposed between the adjacent light-emitting element rows 2. Along the first direction x, relative dimensions of the shift register circuit 40 and the light-emitting element 20 do not represent relative dimensions of both the shift register circuit 40 and the light-emitting element 20 in an actual product. In addition, when the left frame and the right frame of an existing product are both provided with the driver circuits, the shift register circuits on two sides may be disposed between adjacent light-emitting element rows. FIG. 1 is illustrated by only using an example in which the shift register circuit on the left side is disposed between adjacent light-emitting element rows, and those skilled in the art may design according to an actual situation.

In one embodiment, the light-emitting element may be a light-emitting diode (LED), and in particular, a micro-LED or a mini-LED. As shown in FIG. 1, the multiple light-emitting elements may include light-emitting elements having different light-emitting colors. Red light-emitting elements 201, green light-emitting elements 202, and blue light-emitting elements 203 may be periodically arranged in one light-emitting element row 2.

Different types of pixel circuits require different driver circuits, and the types of the pixel circuits are not limited in the embodiments of the present disclosure. For instance, a 2T1C (2 thin film transistors and 1 capacitor) pixel circuit is used as an example, in which the driver circuit includes a scan driver circuit. Similarly, a 7T1C (7 thin film transistors and 1 capacitor) pixel circuit is used as an example, in which the driver circuit includes a scan driver circuit and a light-emitting control driver circuit. In view of the fact that the 7T1C pixel circuit may achieve the threshold compensation and a drive current is more stable, the following description is provided with reference to a pixel circuit being the 7T1C pixel circuit as an example. Each-stage shift register circuit included in at least one of the scan driver circuit or the light-emitting control driver circuit may be disposed between adjacent light-emitting element rows so as to achieve the narrow frame on the left and right sides and even no frame on the left and right sides.

Figure 4:
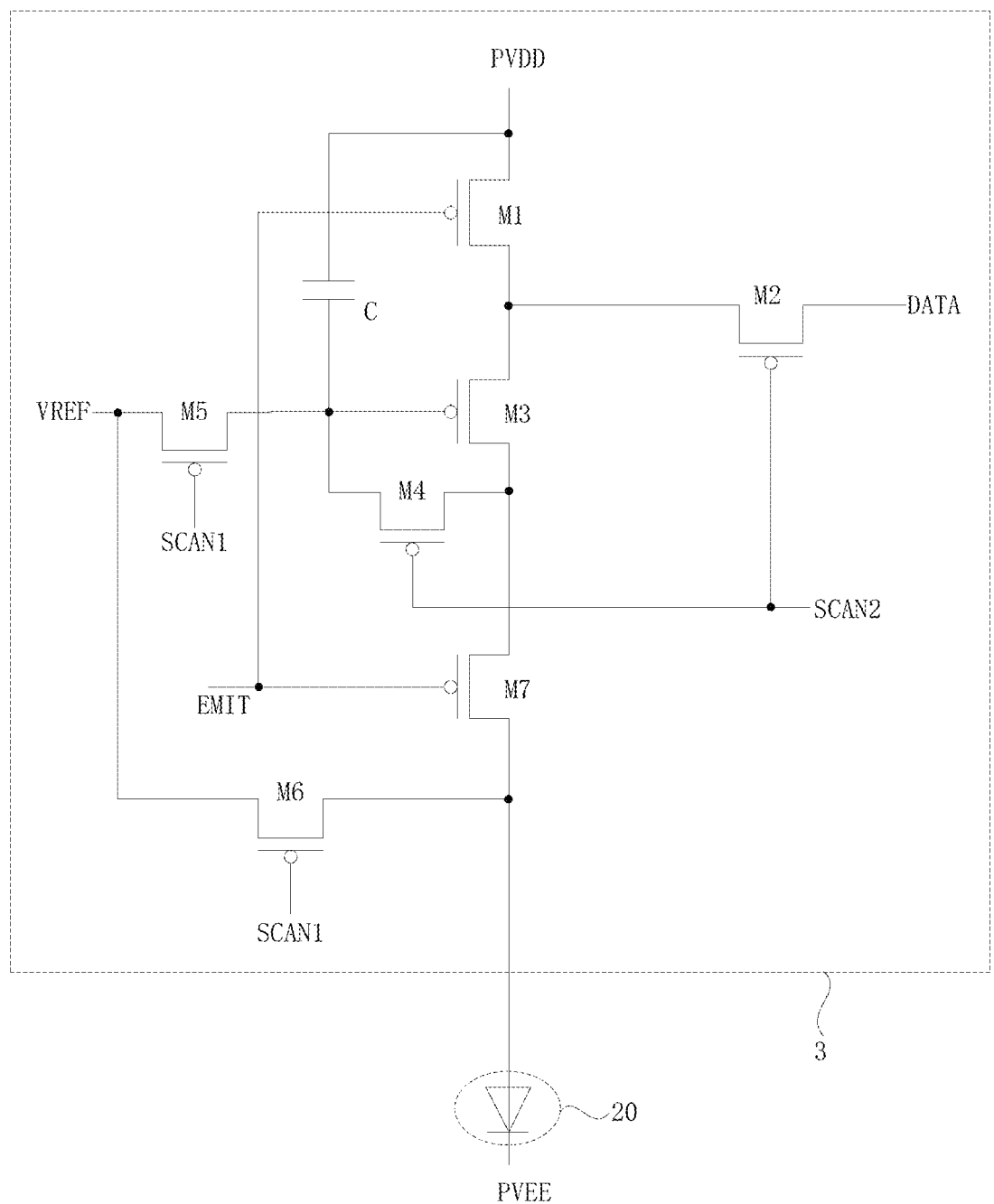
FIG. 4 is a schematic circuit diagram of a pixel circuit.

FIG. 4 is an exemplary schematic circuit diagram of a pixel circuit that includes 7 thin film transistors and 1 capacitor. The working principle of the pixel circuit is not described herein in detail. A third transistor M3 is a drive transistor. When the third transistor M3 generates a drive current so as to drive the light-emitting element 20 to emit light, a path between a first power signal terminal PVDD and a second power signal terminal PVEE is conducted. The first power signal terminal PVDD is electrically connected to a first power line, and the second power signal terminal PVDD is electrically connected to a second power line. The voltage potential of the first power line is greater than the voltage potential of the second power line. As shown in FIG. 4, a first transistor M1 and a seventh transistor M7 receive a light-emitting control signal EMIT. The light-emitting control signal EMIT is provided by a respective light-emitting control shift register circuit in the light-emitting control driver circuit; a fifth transistor M5 and a sixth transistor M6 receive a first scan signal SCAN1, and the first scan signal SCAN1 is provided by a respective scan shift register circuit in the scan driver circuit; a second transistor M2 and a fourth transistor M4 receive a second scan signal SCAN2, and the second scan signal SCAN2 is provided by a respective scan shift register circuit in the scan driver circuit; or the fifth transistor M5 receives the first scan signal SCAN1. The second transistor M2, the fourth transistor M4 and the sixth transistor M6 receive the second scan signal SCAN2, which is not limited in the embodiments of the present disclosure.

With continued reference to FIG. 1, in an embodiment, the multiple light-emitting elements 20 are uniformly arranged. The multiple light-emitting elements 20 may be uniformly arranged in units of a single light-emitting element 20. The multiple light-emitting elements 20 may be uniformly arranged in units of pixels, each pixel may include light-emitting elements 20 of three colors, and a distance between the light-emitting elements 20 in a pixel may be different from a distance between the pixels. With this arrangement, the display uniformity and effect is ensured.

With continued reference to FIGS. 1 and 2, in an embodiment, the light-emitting elements 20 are not overlapped with the pixel circuits 3.

In a LED display panel, the multiple light-emitting elements may be transferred to an array substrate in a relatively large quantity and are electrically connected to respective pixel circuits in a bonding manner. According to this embodiment, the light-emitting elements 20 are disposed so as not to overlap with the pixel circuits 3, so that the transistors in the pixel circuits 3 may be prevented from being damaged in a bonding process, and the high quality and the yield of the display panel are maintained.

As shown in FIG. 2, in an embodiment, the display panel 100 further includes contact electrodes 108, the multiple light-emitting elements 20 is bonded to contact electrodes 108, each pixel circuits 3 includes multiple transistors (as shown in FIG. 4); and the contact electrodes 108 are not overlapped with the multiple pixel circuits 3.

FIG. 2 only shows an example of one transistor in the pixel circuit 3. In an embodiment, an electrode of the light-emitting element may be bonded to the contact electrode 108 through an eutectic layer 109. According to the embodiments of the present disclosure, the contact electrodes 108 are not overlapped with the pixel circuits 3, so that the transistors in the pixel circuits 3 may be prevented from being damaged when the light-emitting elements 20 are bonded with the contact electrodes 108, and the high quality and the yield of the display panel are maintained.

As shown in FIG. 2, a buffer layer 101, an active layer 102, a gate insulating layer 103, a first metal layer 104, an interlayer insulating layer 105, a second metal layer 106 and a passivation layer (or planarization layer) 107 are sequentially disposed on a side of the base substrate 1 close to the light-emitting element 20, and a packaging layer 110 is further disposed on a side of the light-emitting element away from the base substrate. The first metal layer 104 shown in FIG. 2 is a gate of the transistor, and the second metal layer 106 is a source and a drain of the transistor. In addition, the first metal layer may, for example, also form a scan line, the second metal layer may, for example, also form a data line, the display panel may, for example, further include a third metal layer, and the third metal layer may, for example, form an electrode of a capacitor or the like. The structure shown in FIG. 2 is only one exemplary schematic and is not limiting. A scheme according to which the pixel circuits 3 does not overlap with the light-emitting elements 20 is within the scope of protection of the present disclosure.

Further, on the premise that the light-emitting elements 20 are ensured not to overlap with the pixel circuits 3, as shown in FIG. 1, the pixel circuits 3 may be offset towards respective light-emitting elements 20 along the second direction y, so as to reserve space between the light-emitting element rows 2 for disposing the shift register circuit 40. Furthermore, along the first direction x, the pixel circuit 3 close to an edge of the display area AA may be slightly offset towards a center of the display area AA relative to a respective light-emitting element 20, and the pixel circuits 3 and respective light-emitting elements 20 are projected and overlapped along the second direction y, so that the pixel circuit 3 at the edge avoids a cutting channel (such as an outer frame of the base substrate 1), and thus the influence on the pixel circuits in a cutting process is avoided. Moreover, along the first direction x, an amount of offset of the pixel circuit 3 relative to the light-emitting element 20 is small, which makes the wiring simpler and facilitates an electrical connection between the pixel circuits and the respective light-emitting elements.

With continued reference to FIG. 1, in an embodiment, the light-emitting elements 20 do not overlap with the driver circuits 4. In an embodiment, the light-emitting elements 20 do not overlap with the shift register circuit 40.

In the LED display panel, the multiple light-emitting elements may be transferred to an array substrate in a relatively large quantity and are bonded with the contact electrodes. According to this embodiment, the light-emitting elements 20 are disposed so as not to overlap with the driver circuits 4, so that the transistors in the driver circuits 4 may be prevented from being damaged in a bonding process. This ensure that the quality and the yield of the display panel is maintained at a high level.

Figure 5:
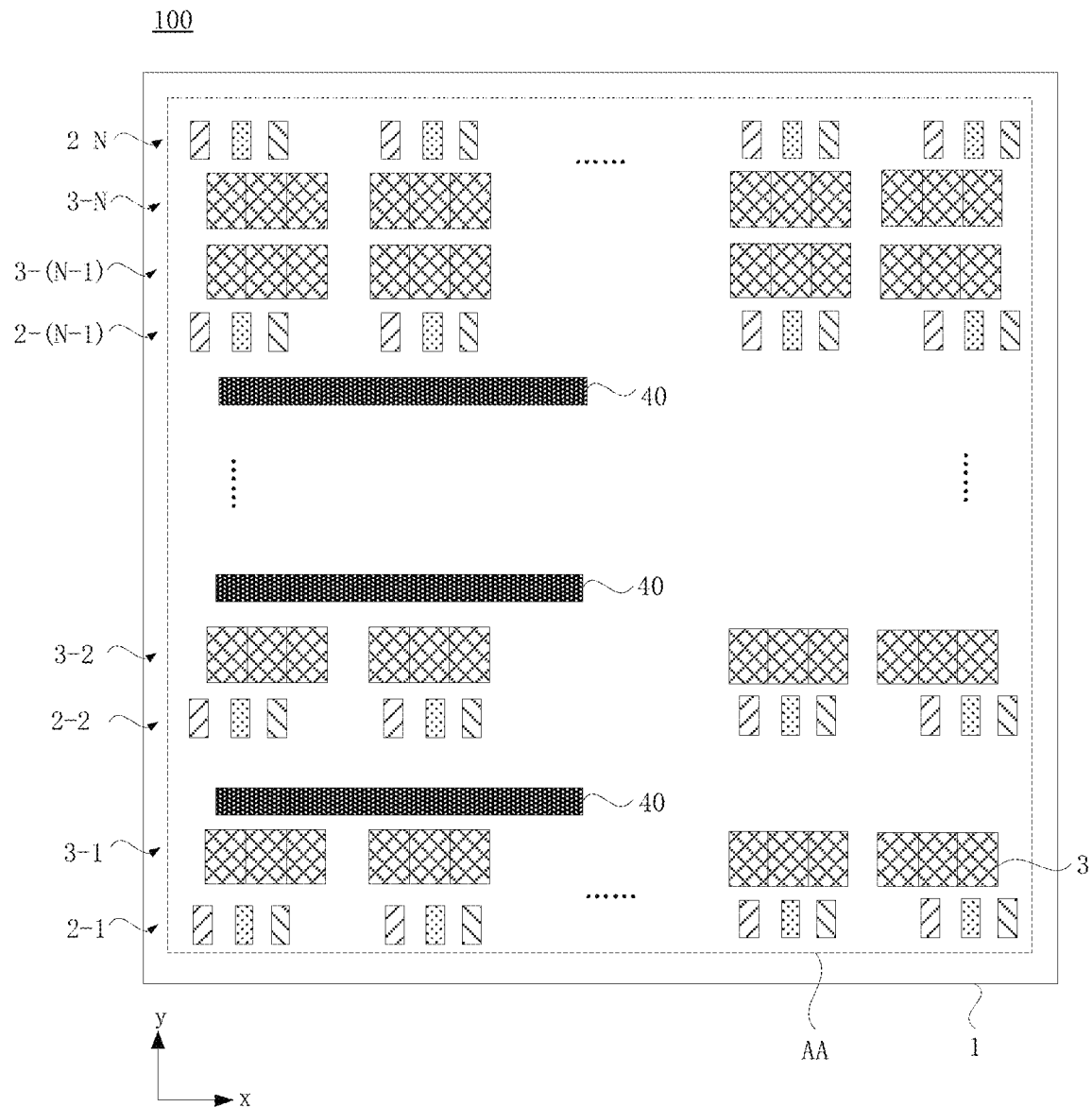
FIG. 5 is a schematic structural diagram of another display panel provided in an embodiment of the present disclosure.

FIG. 5 is a schematic structural diagram of a display panel provided in accordance with another embodiment of the present disclosure. In FIG. 5, a reference numeral "2" represents a light-emitting element row, and numbers (1 to N) behind the reference numeral "2" represent a number of rows where the light-emitting element row is located; a reference numeral 3 represents a pixel circuit, numbers (1 to N) behind the reference numeral 3 represent a number of rows where the pixel circuit is located. This scheme is used in subsequent drawings and thus is not repeated.

Referring to FIG. 5, optically, the multiple light-emitting element rows includes an i-th light-emitting element row and an (i+1)-th light-emitting element row; where i≥1 and i is an integer; the multiple pixel circuits include an i-th row of pixel circuit and an (i+1)-th row of pixel circuit, the i-th row of pixel circuit is configured to drive multiple light-emitting elements in the i-th light-emitting element row, and the (i+1)-th pixel circuit is configured to drive multiple light-emitting elements in the (i+1)-th light-emitting element row. Along the second direction y, the i-th row of pixel circuit and the (i+1)-th row of pixel circuit are located between the i-th light-emitting element row and the (i+1)-th light-emitting element row, and no shift register circuit is disposed between the i-th light-emitting element row and the (i+1)-th light-emitting element row.

In an embodiment, if no shift register circuit is disposed between the i-th light-emitting element row and the (i+1)-th light-emitting element row. The i-th row of pixel circuit and the (i+1)-th row of pixel circuit are disposed between the i-th light-emitting element row and the (i+1)-th light-emitting element row, so as to reserve more space for disposing the shift register circuit between other light-emitting element rows, thereby reducing the manufacturing difficulty.

FIG. 5 illustrates an example in which a (N−1)-th row of pixel circuit 3-(N−1) and a N-th row of pixel circuit 3-N are disposed between a (N−1)-th light-emitting element row 2-(N−1) and a N-thight-emitting element row 2-N, and no shift register circuit is disposed between the (N−1)-th light-emitting element row 2-(N−1) and the N-th light-emitting element row 2-N. With this arrangement, more space may be reserved between a 1-st light-emitting element row 2-1 and the (N−1)-th of light-emitting element row 2-(N−1) for disposing the shift register circuit 40, thereby reducing the preparation difficulty. In addition, since the N-th light-emitting element row 2-N is close to an upper edge of the display area, the N-th row of pixel circuit 3-N is disposed between the (N−1)-th light-emitting element row 2-(N−1) and the N-th light-emitting element row 2-N, the N-th row of pixel circuit 3-N may also be made farther away from a cutting channel above the display panel, and thus the influence on the pixel circuits in a cutting process is avoided.

It should be noted that the structure shown in FIG. 5 is only exemplary and not limiting. In other embodiments, no shift register circuit is disposed between any two adjacent rows of light-emitting element rows and two rows of pixel circuits corresponding to the two rows of light-emitting elements may be disposed between these two adjacent rows of light-emitting element rows, which is not limited in the embodiments of the present disclosure.

Figure 6:
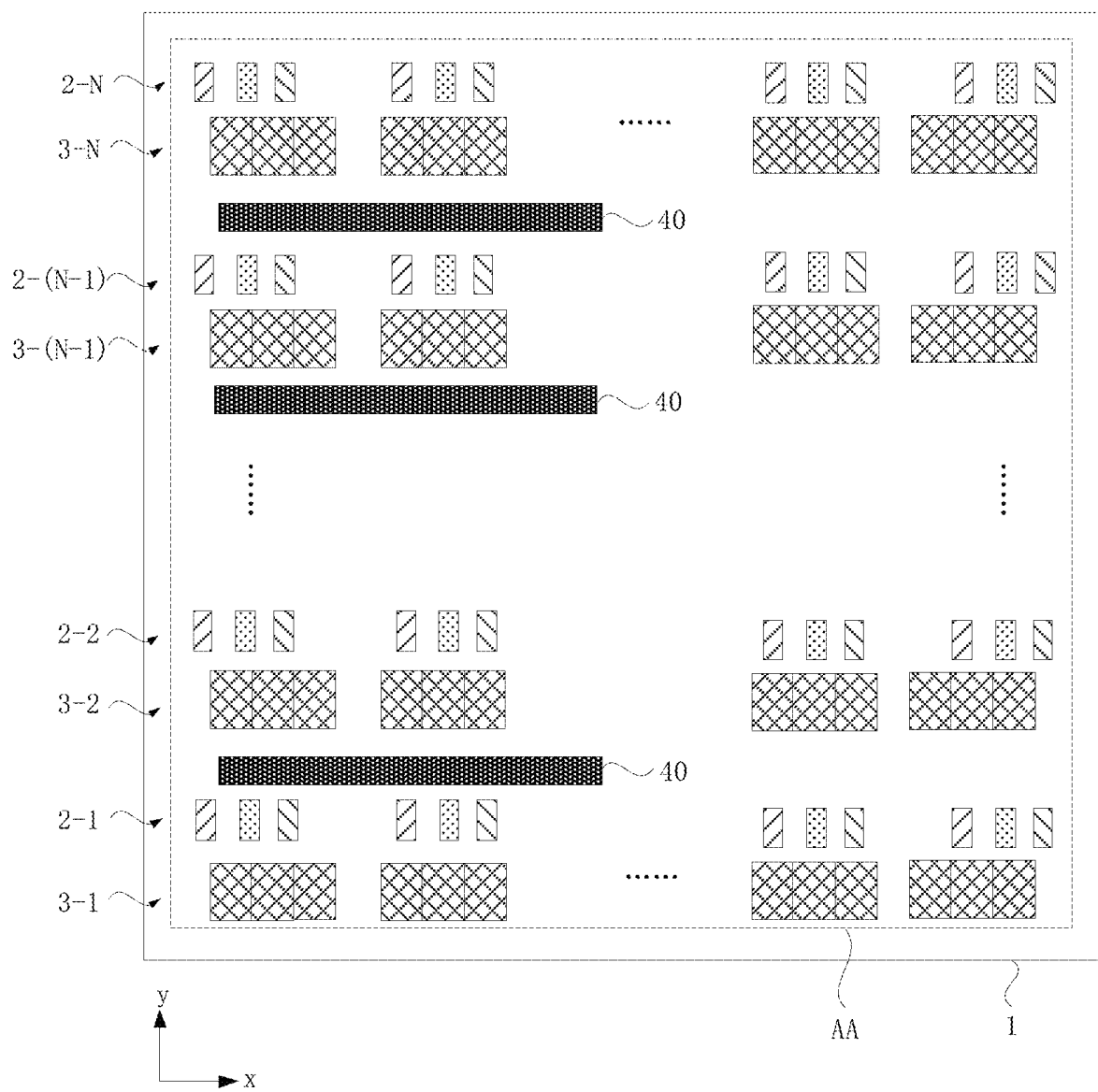
FIG. 6 is a schematic structural diagram of another display panel provided in an embodiment of the present disclosure.

FIG. 6 is a schematic structural diagram of a display panel according to another embodiment of the present disclosure. Referring to FIG. 4 or FIG. 6, in an embodiment, the multiple light-emitting element rows includes an j-th light-emitting element row and an (j+1)-th light-emitting element row; where j≥1 and j is an integer; the multiple pixel circuits include an j-th row of pixel circuit and an (j+1)-th row of pixel circuit, the j-th row of pixel circuit is configured to drive multiple light-emitting elements in the j-th light-emitting element row, and the (j+1)-th row of pixel circuit is configured to drive multiple light-emitting elements in the (j+1)-th light-emitting element row; and along the second direction y, the j-th row of pixel circuit is disposed on a side of the of light-emitting element row away from the (j+1)-th light-emitting element row, and the (j+1)-th row of pixel circuit is disposed on a side of the (j+1)-th light-emitting element row facing the j-th light-emitting element row, and the shift register circuit is disposed between the j-th light-emitting element row and the (j+1)-th light-emitting element row (referring to FIG. 6); or along the second direction y, the j-th row of pixel circuit is disposed on a side of the j-th light-emitting element row facing the (j+1)-th light-emitting element row, and the (j+1)-th row of pixel circuit is disposed on a side of the (j+1)-th light-emitting element row away from the j-th light-emitting element row, and the shift register circuit is disposed between the j-th light-emitting element row and the (j+1)-th light-emitting element row (referring to FIG. 5).

In an embodiment, if the shift register circuit is disposed between adjacent light-emitting element rows, for this part of the light-emitting element rows, each row of pixel circuit corresponding to each light-emitting element row may be uniformly disposed on a same side of the corresponding light-emitting element, in this way, the space for the placement of the shift register circuit may be reserved between the adjacent light-emitting element rows, and the reserved space is consistent throughout, so that the layout of each structure in the display area is relatively uniform.

As shown in FIG. 5, the display panel includes N light-emitting element rows (2-1 to 2-N), the 1-st light-emitting element row 2-1 to the (N−1)-th light-emitting element row 2-(N−1), and the shift register circuit 40 is disposed between two adjacent light-emitting element rows, along the second direction y, a row of pixel circuit corresponding to any row of light-emitting elements is disposed on a side of the light-emitting element row facing a next row of light-emitting element row, in this way, space of disposing the shift register circuit may be reserved between the adjacent light-emitting element rows in the 1-st light-emitting element row 2-1 to the (N−1)-th light-emitting element row 2-(N−1), and the reserved space is basically consistent, so that the layout of each structure in the display area is relatively uniform.

As shown in FIG. 6, the display panel includes N light-emitting element rows (2-1 to 2-N), one row of pixel circuit corresponding to any row of light-emitting elements is disposed on a side of the light-emitting element row away from a next row of light-emitting element row, in this way, the space for placement of the shift register circuit may be reserved between the adjacent light-emitting element rows, and the reserved space is consistent throughout, so that the layout of each structure in the display area is relatively uniform.

Figure 7:
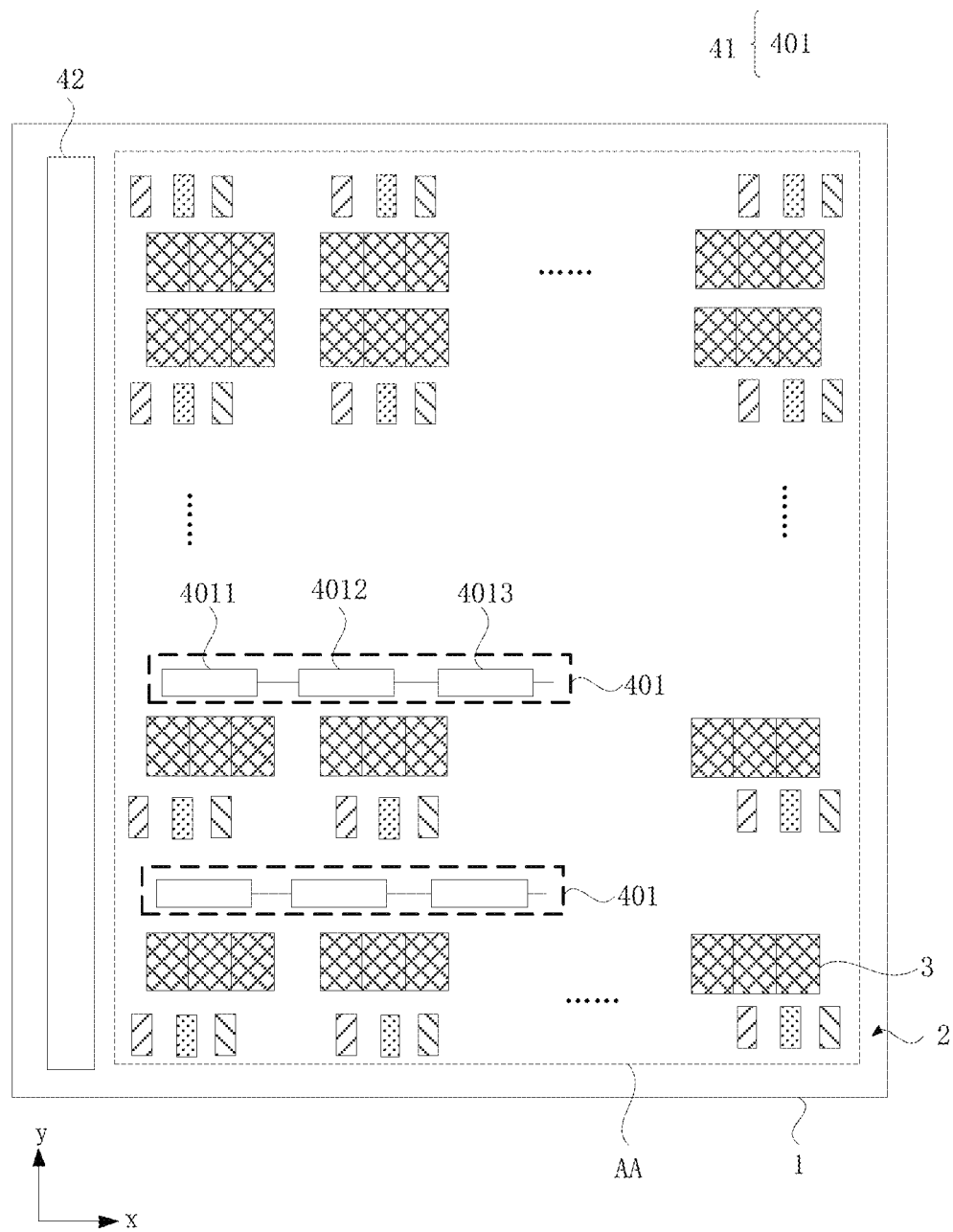
FIG. 7 is a schematic structural diagram of another display panel provided in an embodiment of the present disclosure.

As described above, for the 7T1C pixel circuit, the driver circuit includes the scan driver circuit and the light-emitting control driver circuit. FIG. 7 is a schematic structural diagram of a display panel according to another embodiment of the present disclosure. Referring to FIG. 7, and in an embodiment, the driver circuit includes a scan driver circuit 41, the scan driver circuit 41 includes multiple scan shift register circuits 401 disposed in cascade, and the scan shift register circuit 401 is located between adjacent light-emitting element rows 2.

As shown in FIG. 7, a light-emitting control driver circuit 42 is disposed in a frame area (a left frame as shown in the drawings), and only the scan shift register circuit 401 in the scan driver circuit 41 is disposed between adjacent light-emitting element rows, in this way, the left and right frames of the display panel may be reduced.

With continued reference to FIG. 7, the scan shift register circuit 401 includes a first latch module 4011, a logic module 4012, and a first buffer module 4013 which are arranged along the first direction x.

According to some embodiments of the present disclosure, the scan shift register circuit 401 is divided into the first latch module 4011, the logic module 4012 and the first buffer module 4013, and the first latch module 4011, the logic module 4012 and the first buffer module 4013 are arranged along the first direction x, so that a length of space occupied by the scan shift register circuit 41 along the second direction y may be reduced, space occupied by the light-emitting element 20 and the pixel circuit 3 is prevented from being excessively compressed, it is ensured that a small reserved space is enough to accommodate the scan shift register circuit 401, and thus the process difficulty is reduced.

It should be noted that the scan shift register circuit 401 is not limited to being divided into the first latch module 4011, the logic module 4012, and the first buffer module 4013, and the scan shift register circuit may be divided into several modules as required, which is not limited in the embodiments of the present disclosure.

Figure 8:
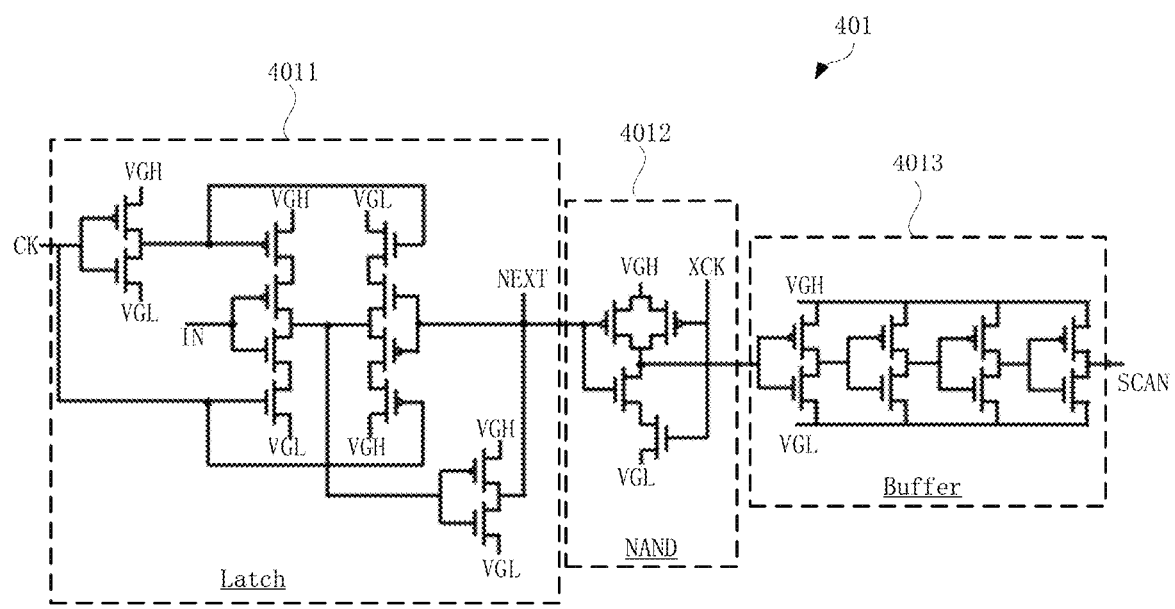
FIG. 8 is a specific schematic circuit diagram of a scan shift register circuit in FIG. 7.

FIG. 8 is a schematic circuit diagram of a scan shift register circuit shown in FIG. 7. The scan shift register circuit may be divided into the first latch module 4011, the logic module (NAND) 4012, and the first buffer module 4013 in a manner shown in FIG. 8. The operating principle of the scan shift register circuit is not described in detail herein.

It should be noted that the scan shift register circuit 401 shown in FIG. 8 is exemplary and is not limiting, and any known scan shift register circuit may be adopted and divided into several small modules so as to reduce a length of the space occupied by the scan shift register circuit 41 along the second direction y, so that the scan shift register circuit 401 is not limited. Scan shift register circuits of other structures fall within the scope of the embodiments of the present disclosure as long as the scan shift register circuits include the latch module, the logic module and the buffer module in a function division.

Figure 9:
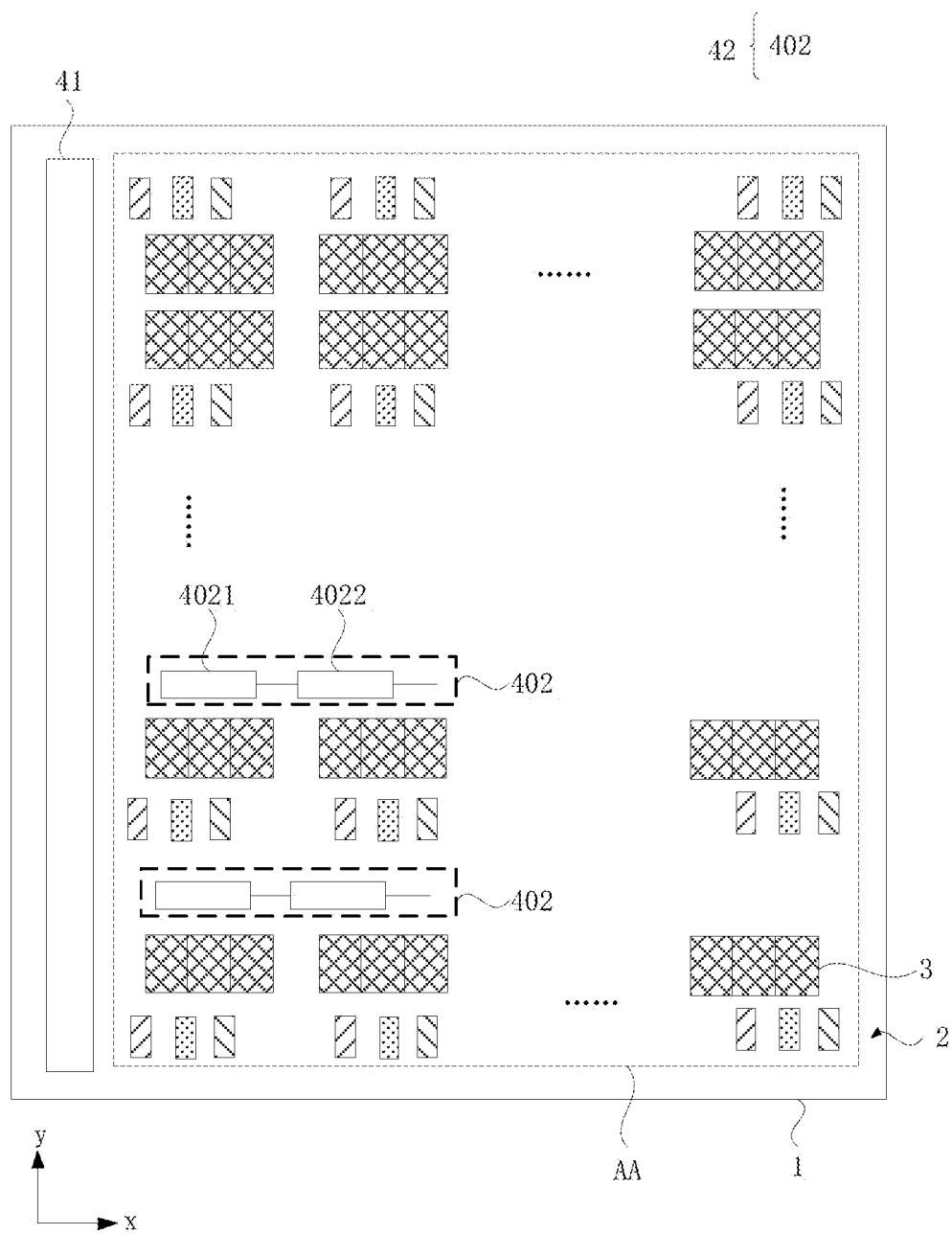
FIG. 9 is a schematic structural diagram of another display panel provided in an embodiment of the present disclosure.

FIG. 9 is a schematic structural diagram of a display panel according to another embodiment of the present disclosure. In an embodiment, the driver circuit includes a light-emitting control driver circuit 42, the light-emitting control driver circuit 42 includes multiple light-emitting control shift register circuits 402 disposed in cascade, and the light-emitting control shift register circuit 402 is located between adjacent light-emitting element rows 2.

As shown in FIG. 9, the scan driver circuit 41 is disposed in the frame area (as shown in the left frame), and only the light-emitting control shift register circuit 402 in the light-emitting control driver circuit 42 is disposed between adjacent light-emitting element rows 2, therefore, the left and right frames of the display panel may be reduced.

With continued reference to FIG. 9, the light-emitting control shift register circuit 402 includes a second latch module 4021 and a second buffer module 4022. The light-emitting control shift register circuit 402 includes a second latch module 4021 and the second buffer module 4022 are arranged along the first direction x.

According to various embodiments of the present disclosure, the light-emitting control shift register circuit 402 is divided into the second latch module 4021 and the second buffer module 4022, and the second latch module 4021 and the second buffer module 4022 are arranged along the first direction x, so that a length of space occupied by the light-emitting control shift register circuit 402 along the second direction y may be reduced. Space occupied by the light-emitting element 20 and the pixel circuit 3 is prevented from being excessively compressed, therefore, it is ensured that a small reserved space is enough to accommodate the light-emitting control shift register circuit 402, and thus further reducing the process difficulty.

It should be noted that the light-emitting control shift register circuit 402 is not limited to being divided into the second latch module 4021 and the second buffer module 4022, and the light-emitting control shift register circuit may be divided into several modules as required.

Figure 10:
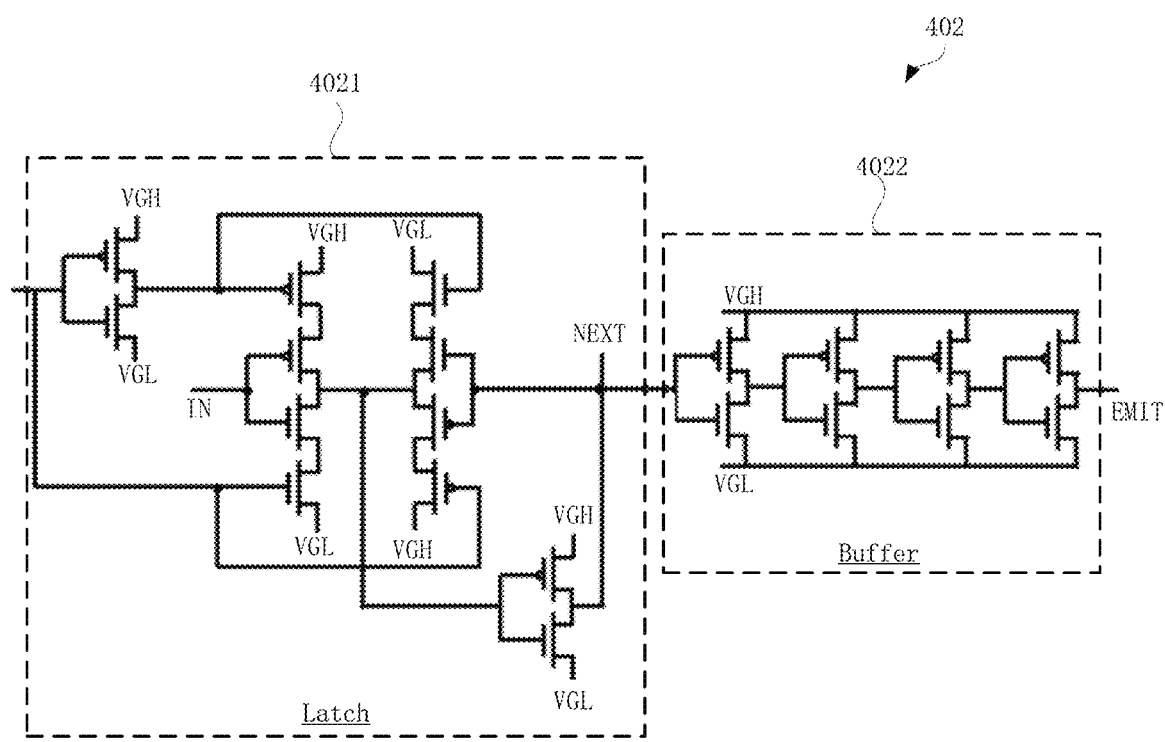
FIG. 10 is a specific schematic circuit diagram of a light-emitting control shift register circuit in FIG. 9.

FIG. 10 is a schematic circuit diagram of a light-emitting control shift register circuit shown in FIG. 9. The light-emitting control shift register circuit may be divided into the second latch module 4021 and the second buffer module 4022 in a manner shown in FIG. 10. The operation of the light-emitting control shift register circuit is not described herein.

It should be noted that the light-emitting control shift register circuit 402 shown in FIG. 10 is only exemplary and is not limiting, and any known light-emitting control shift register circuit may be used and divided into several small modules so as to reduce the of space occupied by the light-emitting control shift register circuit 402 along the second direction y, so that the light-emitting control shift register circuit 402 is not limited, and light-emitting control shift register circuits of other structures fall within the scope of the embodiments of the present disclosure as long as the light-emitting control shift register circuit includes the latch module and the buffer module in a function division.

It should also be noted that FIG. 7 and FIG. 9 are illustrated only by using an example in which the shift register circuit in the scan driver circuit 41 or the light-emitting control driver circuit 42 is disposed between adjacent light-emitting element rows. In other embodiments, the shift register circuit in the scan driver circuit and the light-emitting control driver circuit may be disposed between adjacent light-emitting element rows, so that no frame on left and right sides is achieved.

Figure 11:
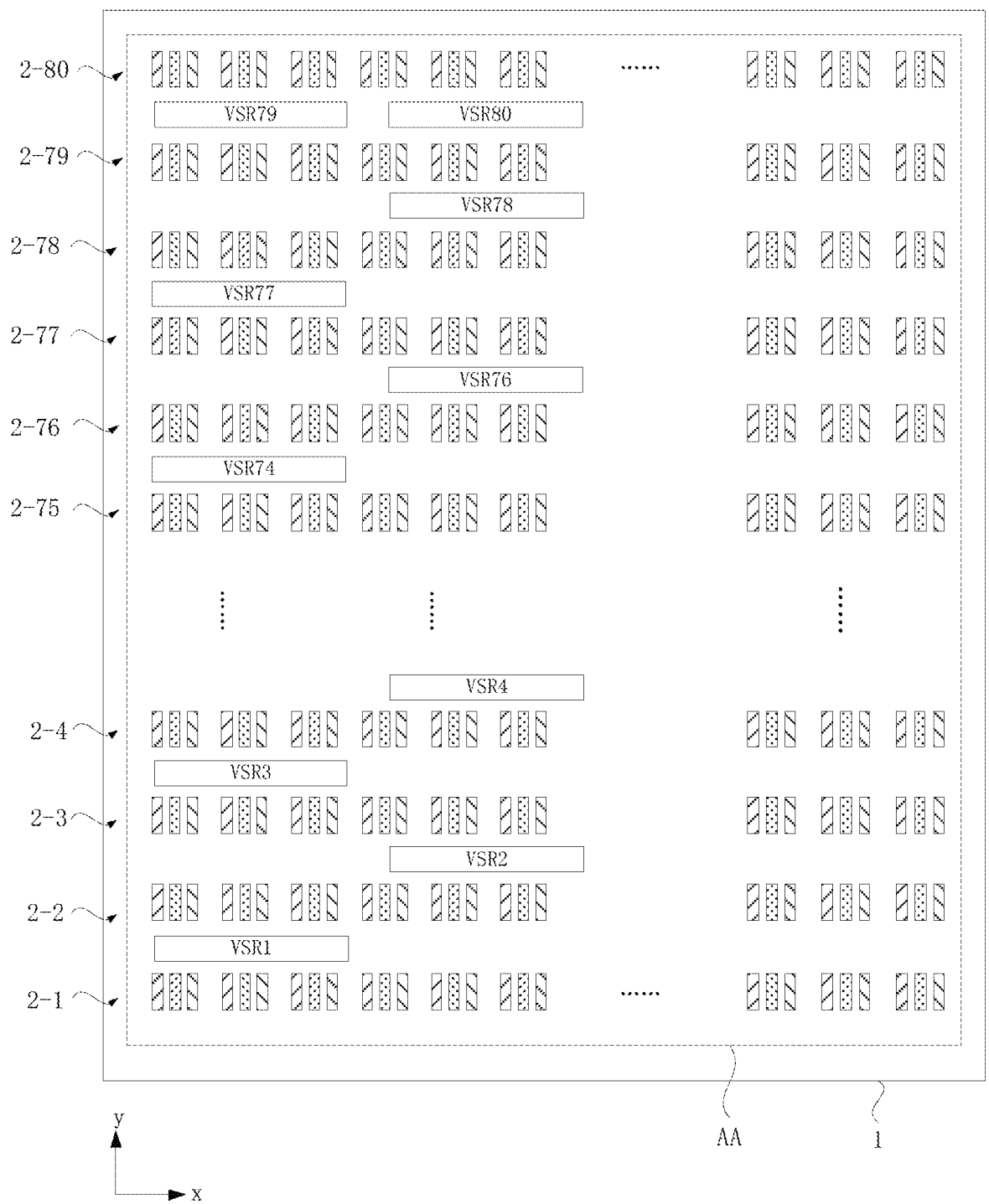
FIG. 11 is a schematic structural diagram of another display panel provided in an embodiment of the present disclosure.

FIG. 11 is a schematic structural diagram of a display panel according to another embodiment of the present disclosure. FIG. 11 does not show a pixel circuit. Referring to FIG. 11, in an embodiment, at least one light-emitting element row group is provided with two shift register circuits (VSRs, a number behind the VSR represents a number of stages where the shift register circuit is located) disposed in cascade, and the at least one light-emitting element row group includes two light-emitting element rows disposed adjacent to each other along the second direction y (for example a light-emitting element row 2-1 and a light-emitting element row 2-2 form a light-emitting element row group).

In general, a number of the shift register circuits in the driver circuit is greater than or equal to a number of rows of the pixel circuits. For example, for the light-emitting control driver circuit, a light-emitting control shift register circuit corresponds to a row of pixel circuit and the light-emitting control shift register circuit is configured to provide a light-emitting control signal for this row of pixel circuit in a light-emitting stage. For the scan driver circuit, a first scan shift register circuit is generally utilized to provide a first scan signal in an initialization stage of a first row of pixel circuit, and a second scan shift register circuit is generally utilized to provide a second scan signal in a data writing stage of the first row of pixel circuit. Meanwhile, the first scan signal is provided at an initialization stage of a second row of pixel circuit, and so on, the first scan signal and the second scan signal are provided for each row of pixel circuit, so that the number of the scan shift register circuits is one more than the number of rows of the pixel circuits in general.

If all light-emitting element row groups are provided with the shift register circuit, since a number of the light-emitting element row groups is one less than the number of rows of the pixel circuits, at least one group of light-emitting element row group may be provided with two shift register circuits disposed in cascade, therefore, it is ensured that the shift register circuits may be disposed in the light-emitting element row 2, so that the narrow frame or even no frame design of the display panel is achieved, and thus the screen-to-body ratio of the display panel is increased.

As shown in FIG. 11, for example, the display panel includes 80 light-emitting element rows (2-1 to 2-80), and thus a number of light-emitting element row groups is 79. If a number of shift register circuits VSR is 80, then the at least one light-emitting element row group is provided with the two shift register circuits disposed in cascade. FIG. 11 is illustrated by using an example in which the 79-th shift register circuit VSR79 and the 80-th shift register circuit VSR80 which are disposed in cascade are disposed in a light-emitting element row group composed of a light-emitting element row 2-79 and a light-emitting element row 2-80. Subsequent drawings are labeled in the same manner as shown in FIG. 11.

Figure 12:
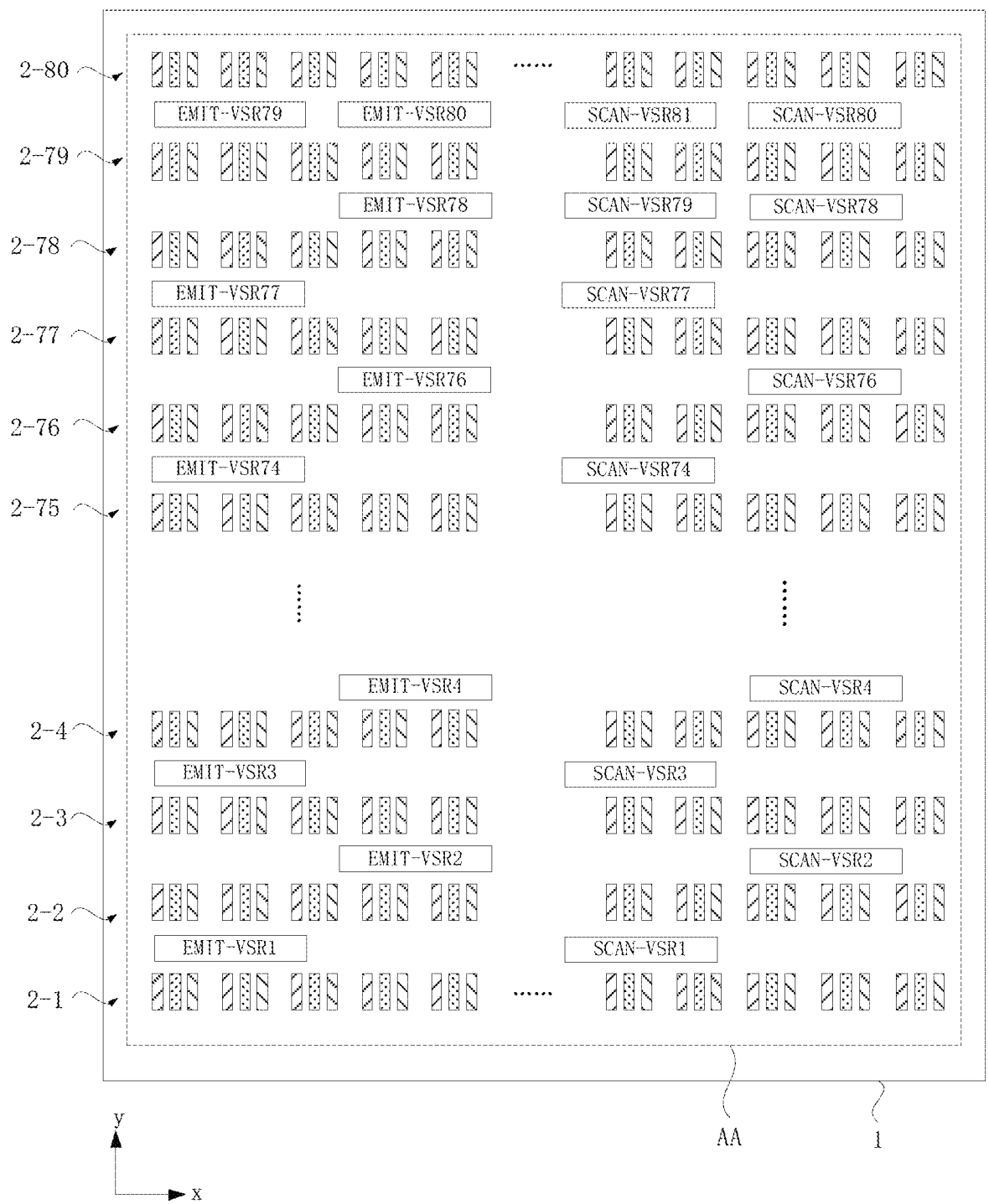
FIG. 12 is a schematic structural diagram of another display panel provided in an embodiment of the present disclosure.

FIG. 12 is a schematic structural diagram of a display panel according to another embodiment of the present disclosure. Referring to FIG. 12, the driver circuit includes a scan driver circuit and a light-emitting control driver circuit. The scan driver circuit includes multiple scan shift register circuits (SCAN-VSRs) disposed in cascade, and the light-emitting control driver circuit includes multiple light-emitting control shift register circuits (EMIT-VSRs) disposed in cascade; each of at least two light-emitting element row groups is provided with two scan shift register circuits (SCAN-VSRs) disposed in cascade; and at least one light-emitting element row group is provided with two light-emitting control shift register circuits (EMIT-VSRs) disposed in cascade.

As described above, in view of the fact that the number of the scan shift register circuits is one more than the number of rows of the pixel circuits, and the number of the light-emitting element row groups is one less than the number of rows of the pixel circuits, if all light-emitting element row groups are provided with the scan shift register circuit, then each of the at least two light-emitting element row groups may be provided with the two scan shift register circuits disposed in cascade. It is thus ensured that the scan shift register circuit and the light-emitting control shift register circuit may be disposed in the light-emitting element row 2, so that the narrow frame or even no frame design of the display panel is achieved, and thus the screen-to-body ratio of the display panel is increased. As shown in FIG. 12, a light-emitting element row group composed of a light-emitting element row 2-79 and a light-emitting element row 2-80 is provided with an 81-th scan shift register circuit SCAN-VSR81 and an 80-th scan shift register circuit SCAN-VSR80 which are disposed in cascade, and a 78-th scan shift register circuit SCAN-VSR78 and a 79-th scan shift register circuit SCAN-VSR79 which are disposed in cascade are disposed in a light-emitting element row group composed of a light-emitting element row 2-78 and the light-emitting element row 2-79.

Moreover, in view of the fact that the number of the light-emitting control shift register circuits is equal to the number of rows of the pixel circuits, and the number of the light-emitting element row groups is one less than the number of rows of the pixel circuits, if all light-emitting element row groups are provided with the light-emitting control shift register circuit, then the at least one light-emitting element row group may be provided with the two light-emitting control shift register circuits disposed in cascade. It is therefore ensured that the scan shift register circuit and the light-emitting control shift register circuit may be disposed in the light-emitting element row 2, so that the narrow frame or even no frame design of the display panel is achieved, and thus the screen-to-body ratio of the display panel is increased. As shown in FIG. 12, a light-emitting element row group composed of a light-emitting element row 2-79 and a light-emitting element row 2-80 is provided with a 79-th light-emitting control shift register circuit EMIT-VSR79 and an 80-th light-emitting control shift register circuit EMIT-VSR80 which are disposed in cascade.

Figure 13:
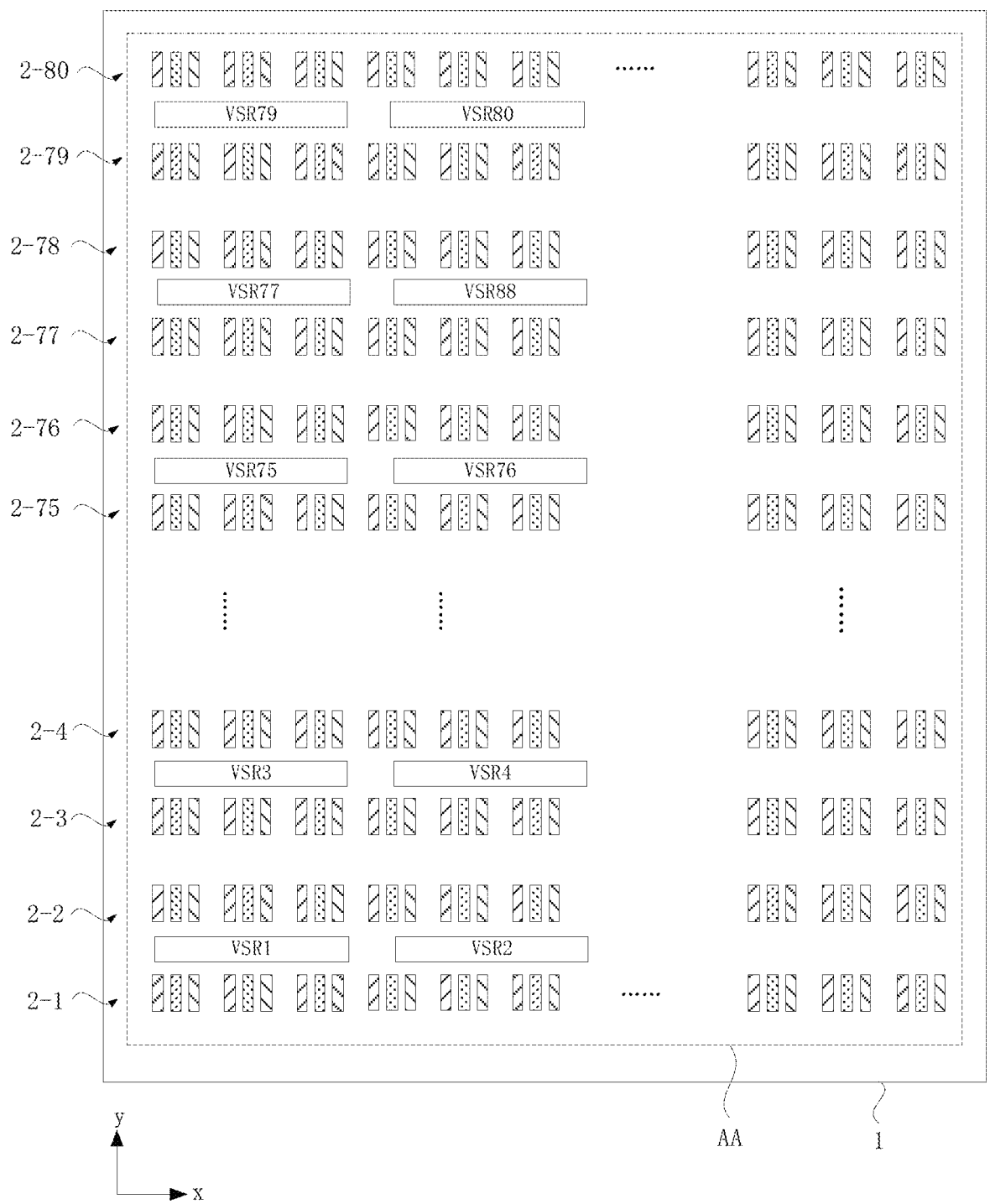
FIG. 13 is a schematic structural diagram of another display panel provided in an embodiment of the present disclosure.

Under the condition that the number of the shift register circuits is not considered, no matter which shift register circuit, the two shift register circuits disposed in cascade are disposed in any light-emitting element row group that are provided with the shift register circuit. FIG. 13 is a schematic structural diagram of a display panel according to another embodiment of the present disclosure. The specific setting manners of the scan shift register circuit and the light-emitting control shift register circuit are not limited to the embodiments described herein. The scan shift register circuit and the light-emitting control shift register circuit only need to be ensured to be disposed between light-emitting element rows, so that the narrow frame or even no frame design of the display panel is achieved, and thus the screen-to-body ratio of the display panel is increased.

With continued reference to FIG. 11, at least two stages of shift register circuits are located in different light-emitting element row groups, the same light-emitting element row group includes two light-emitting element rows which are disposed adjacent to each other along the second direction y. The two stages of shift register circuits disposed in cascade are disposed within a same light-emitting element row group. The difference between the shift register circuit and the light-emitting element row group may be accounted for, however, the difference between the number of the shift register circuits and the number of the light-emitting element row groups is small no matter the scan shift register circuit or the light-emitting control shift register circuit. Therefore part of the shift register circuits may be located in different light-emitting element row groups, in this way, the shift register circuits are close to the respective pixel circuits, the wiring is facilitated, and the process difficulty is reduced. As shown in FIG. 11, only one shift register circuit VSR is disposed in each of multiple light-emitting element row groups composed of the light-emitting element row 2-1 to the light-emitting element row 2-79.

Figure 14:
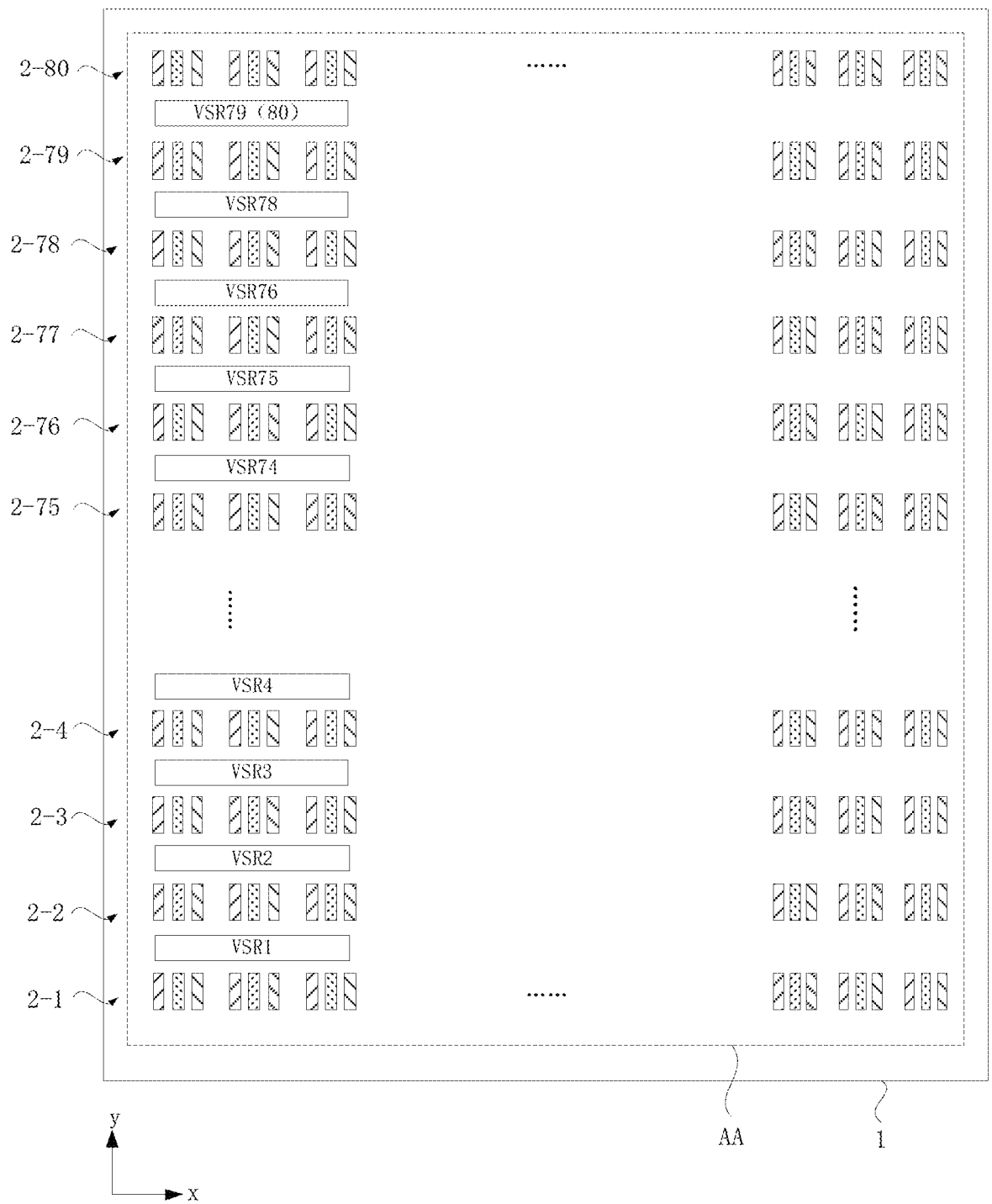
FIG. 14 is a schematic structural diagram of another display panel provided in an embodiment of the present disclosure.

In addition to the above-described conventional quantity relationship, in a special case, no matter the scan shift register circuit or the light-emitting control shift register circuit, the shift register circuit may correspond to multiple rows of pixel circuits simultaneously, and provide drive signals (such as a light-emitting control signal, a first scan signal, and a second scan signal) for multiple rows of pixel circuits simultaneously, at this time, the number of the shift register circuits in the driver circuit may be less than numbers of pixel circuit rows and light-emitting element rows, so that each shift register circuit may be located in a different light-emitting element row group, as shown in FIG. 14, which is a schematic structural diagram of a display panel according to another embodiment of the present disclosure. It should be noted that, the following description will be given by using an example in which the number of scan shift register circuits is one more than the number of rows of the pixel circuits, and the number of light-emitting control shift register circuits is equal to the number of rows of the pixel circuits.

In an embodiment, when the shift register circuits disposed in cascade are located in different light-emitting element row groups, projections of any two shift register circuits disposed in cascade along the second direction y overlap (as in FIG. 14), or projections of any two shift register circuits disposed in cascade along the second direction y do not overlap and are arranged in a zigzag manner (as in FIG. 11).

Referring to FIG. 11, 12 or 13, in an embodiment, the multiple shift register circuits disposed in cascade include an odd-numbered shift register circuit and an even-numbered shift register circuit; the odd-numbered shift register circuit is disposed along the second direction y, and the even-numbered shift register circuit is disposed along the second direction y; and the odd-numbered shift register circuit and the even-numbered shift register circuit are sequentially disposed along the first direction x.

As shown in FIG. 12, the scan driver circuit and the light-emitting control driver circuit may be divided into the odd-numbered shift register circuit and the even-numbered shift register circuit (as described above, a number in the drawings represents a number of stages of the shift register circuit VSR). Generally, the odd-numbered shift register circuits are electrically connected to a same clock signal line, and the even-numbered shift register circuit is electrically connected to a same clock signal line. Therefore, in the embodiments of the present disclosure, the odd-numbered shift register circuits are disposed along the second direction y, and the even-numbered shift register circuits are disposed along the second direction y; and the odd-numbered shift register circuits and the even-numbered shift register circuits are sequentially disposed along the first direction x, which helps to reduce the wiring difficulty.

When the two shift register circuits disposed in cascade are disposed in the light-emitting element row groups and/or when at least two cascaded shift register circuits are located in different light-emitting element row groups, the above setting manners may be adopted, i.e., the odd-numbered shift register circuits are disposed along the second direction y, and the even-numbered shift register circuits are disposed along the second direction y; and the odd-numbered shift register circuits and the even-numbered shift register circuits are sequentially disposed along the first direction x.

Figure 15:
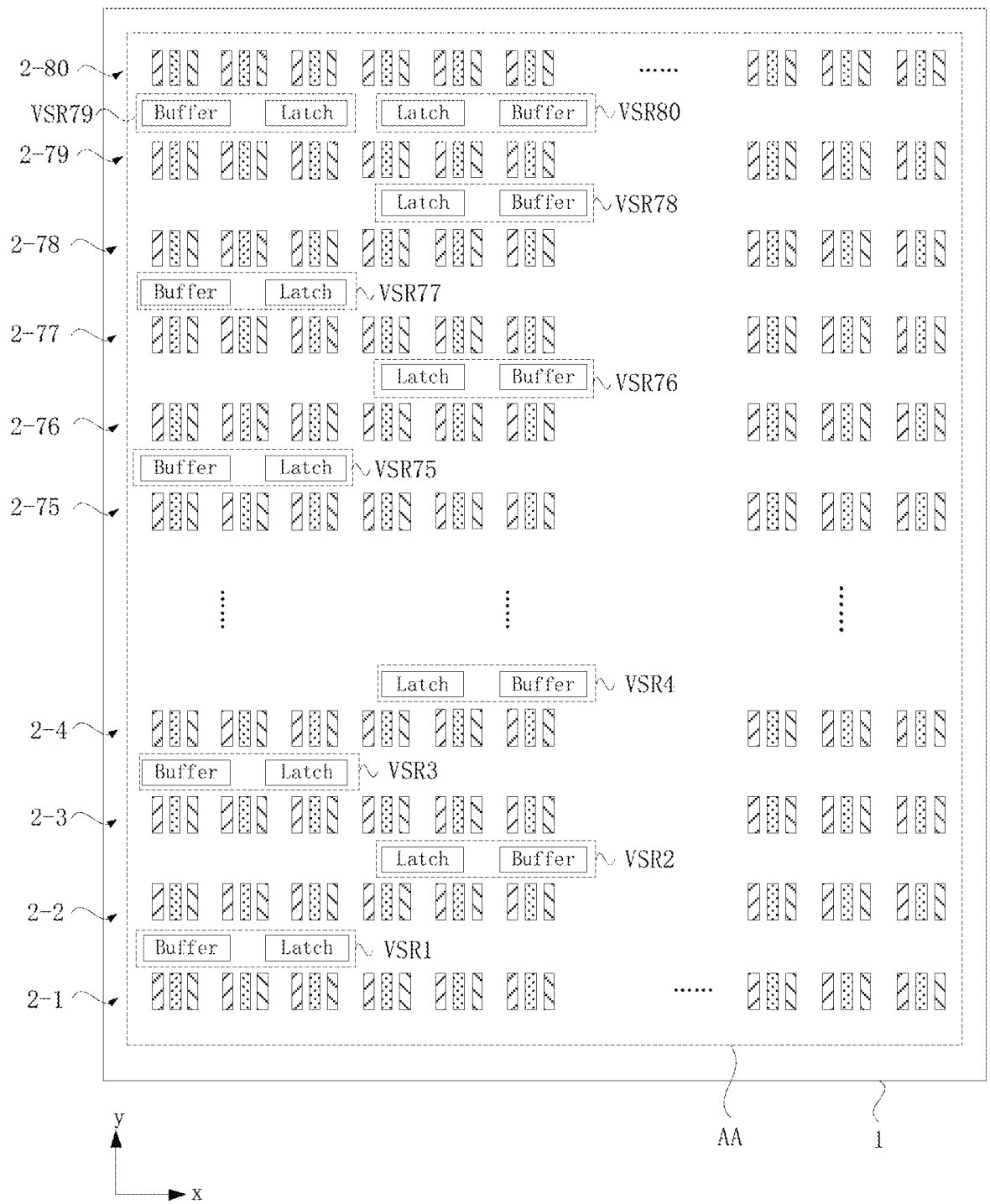
FIG. 15 is a schematic structural diagram of another display panel provided in an embodiment of the present disclosure.

FIG. 15 is a schematic structural diagram of a display panel according to another embodiment of the present disclosure. Referring to FIG. 15, the shift register circuit VSR at least includes a latch module Latch and a buffer module Buffer; along the first direction x, a latch module Latch of the odd-numbered shift register circuit is located on a side of a buffer module Buffer of the odd-numbered shift register circuit facing the even-stage shift register circuit, and a latch module Latch of the even-numbered shift register circuit is located on a side of a buffer module Buffer of the even-stage shift register circuit close to the odd-numbered shift register circuit.

Referring to FIG. 15 and FIG. 7, for the scan shift register circuit (SCAN-VSR), the scan shift register circuit 401 includes a first latch module (Latch) 4011, a logic module (NAND) 4012 and a first buffer module (Buffer) 4013; along the first direction x, the first latch module 4011 of the odd-numbered scan shift register circuit is disposed on a side of the first buffer module 4013 close to the even-stage scan shift register circuit, and the first latch module 4011 of the even-numbered scan shift register circuit is disposed on a side of the first buffer module 4013 of the even-numbered scan shift register circuit close to the odd-numbered scan shift register circuit.

Referring to FIG. 15 and FIG. 9, for the light-emitting control shift register circuit (EMIT-VSR), the light-emitting control shift register circuit 402 includes a second latch module (Latch) 4021 and a second buffer module (Buffer) 4022; along the second direction y, the second latch module 4021 of the odd-numbered light-emitting control shift register circuit is disposed on a side of the second buffer module 4022 of the odd-numbered light-emitting control shift register circuit facing the even-numbered light-emitting control shift register circuit, and the second latch module 4021 of the even-numbered light-emitting control shift register circuit is disposed on a side of the second buffer module 4022 of the even-stage light-emitting control shift register circuit close to the odd-numbered light-emitting control shift register circuit.

In general, no matter the scan shift register circuit or the light-emitting control shift register circuit, when the odd-numbered shift register circuits are disposed along the second direction y, the even-numbered shift register circuits are disposed along the second direction y, and the odd-numbered shift register circuits and the even-numbered shift register circuits are sequentially disposed along the first direction x, and in an embodiment, the latch modules in the shift register circuit are oppositely disposed. The reasons for this are as follows.

Referring to FIG. 8 or FIG. 10, no matter the scan shift register circuit 401 (FIG. 8) or the light-emitting control shift register circuit 402 (FIG. 10), the enable level is transmitted to an input terminal IN of a next shift register circuit through an output terminal NEXT of a current shift register circuit, so as to trigger the next shift register circuit to start working, and thus, all shift register circuits are sequentially cascaded. As can be seen from FIGS. 8 and 10, the output terminal NEXT and the input terminal IN of the scan shift register circuit 401 and the light-emitting control shift register circuit 402 are both located at their latch modules Latch. When the odd-numbered shift register circuits are disposed along the second direction y, the even-numbered shift register circuits are disposed along the second direction y, and the odd-numbered shift register circuits and the even-numbered shift register circuits are sequentially disposed along the first direction x, if a distance between the latch modules of the odd-numbered shift register circuits and the latch modules of the even-numbered shift register circuits is relatively long, then the wiring difficulty is increased, and the cascade connection of the latch modules of the odd-numbered shift register circuits and the latch modules of the even-numbered shift register circuits is not facilitated. According to this embodiment, the latch modules in the odd-numbered shift register circuit and the even-numbered shift register circuit are oppositely disposed, so that the distance between the latch modules in the odd-numbered shift register circuits and the latch modules of the even-numbered shift register circuit may be shortened, adjacent odd-numbered shift register circuit and even-numbered shift register circuit may be cascaded in sequence conveniently, whereby the winding is avoided, and thus the process difficulty is reduced.

Figure 16:
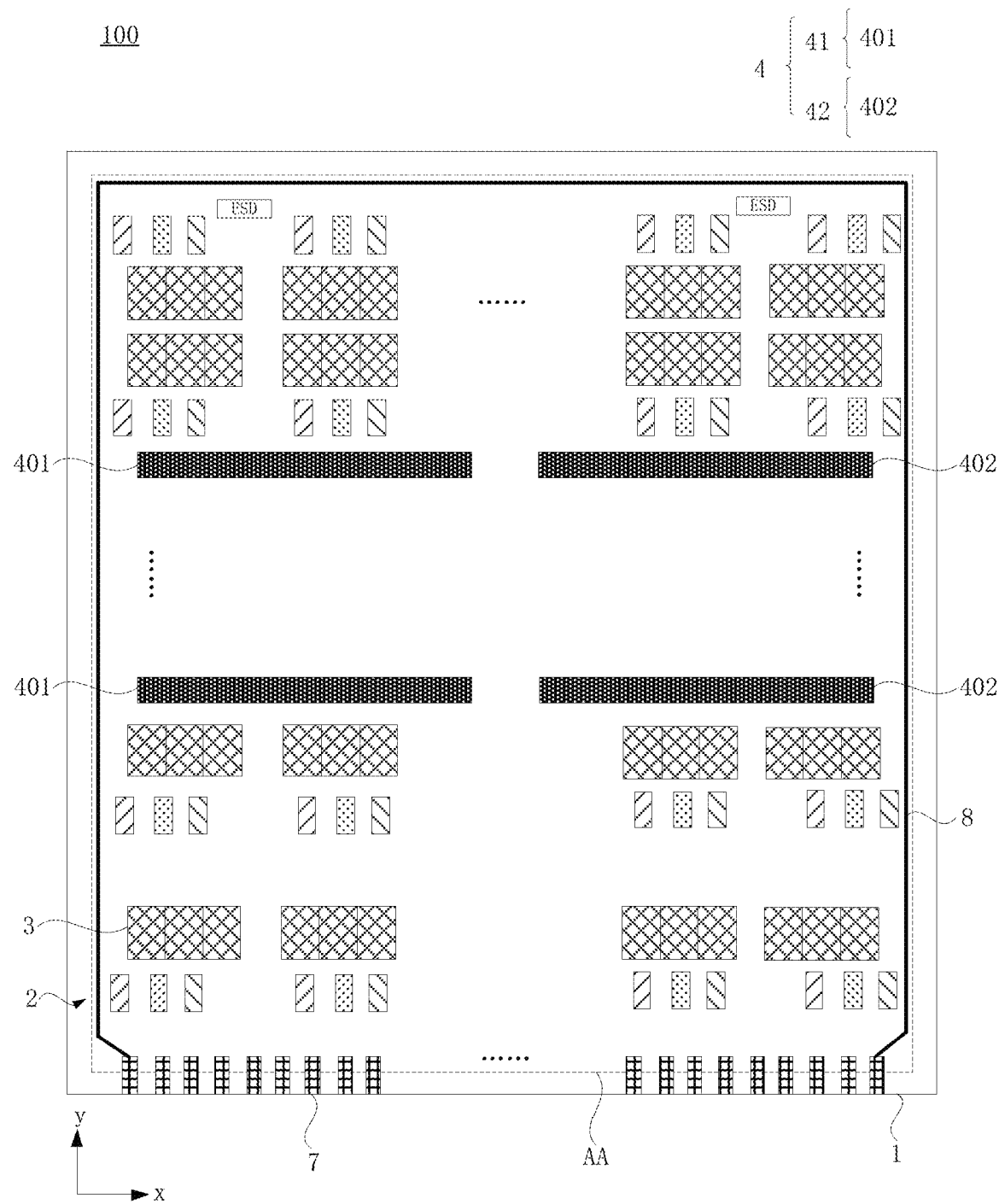
FIG. 16 is a schematic structural diagram of another display panel provided in an embodiment of the present disclosure.

FIG. 16 is a schematic structural diagram of a display according to another embodiment of the present disclosure. Referring to FIG. 16, the display panel includes multiple driver circuits, the multiple driver circuits are sequentially disposed along the first direction x.

As shown in FIG. 16, the multiple driver circuits include a scan driver circuit 41 and a light-emitting control driver circuit 42, and the scan driver circuit 41 and the light-emitting control driver circuit 42 are sequentially disposed along the first direction x, in this way, no frame on the left and right sides is achieved.

In other embodiments, the multiple driver circuits may also refer to multiple scan driver circuits, and the multiple scan driver circuits are disposed along the first direction x, so that different scan driver circuits may be utilized to drive the pixel circuits at different positions so as to reduce the influence of a trace resistance on a scan signal, and ensure normal conduction of a respective thin film transistor in the pixel circuit. Alternatively, the multiple driver circuits may also refer to the multiple light-emitting control driver circuits, the multiple light-emitting control driver circuits are disposed along the first direction x, so that different light-emitting control driver circuits may be utilized to drive pixel circuits at different positions so as to reduce the influence of a trace resistance on a light-emitting control signal, and ensure normal conduction of a respective thin film transistor in the pixel circuit.

Figure 17:
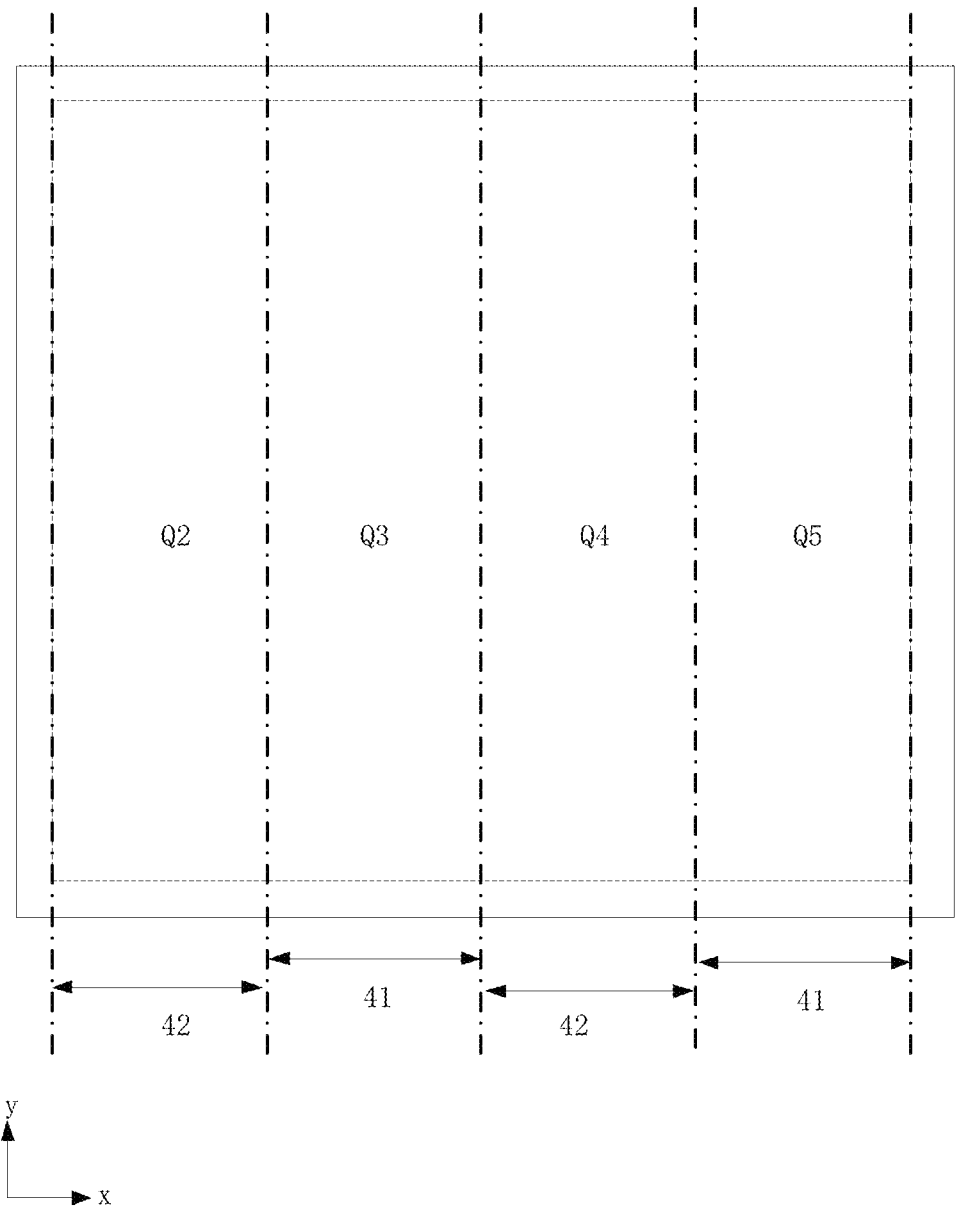
FIG. 17 is a schematic structural diagram of another display panel provided in an embodiment of the present disclosure.

FIG. 17 is a schematic structural diagram of a display panel according to another embodiment of the present disclosure. Referring to FIG. 17, the multiple driver circuits include scan driver circuits 41 and light-emitting control driver circuits 42, and the scan driver circuits 41 and the light-emitting control driver circuits 42 are alternately disposed along the first direction x.

FIG. 17 is illustrated by using an example in which the display panel includes two scan driver circuits 41 and two light-emitting control driver circuits 42, and the scan driver circuits 41 and the light-emitting control driver circuits 42 are alternately disposed along the first direction x. Thus, not only no frame on the left and right sides may be achieved, but also different scan driver circuits 41 and different light-emitting control driver circuits 42 are utilized to drive pixel circuits at different positions so as to reduce the influence of a trace resistance on a drive signal (such as a scan signal and a light-emitting control signal). The description of the above embodiments may be referred to for a manner in which the driver circuit is disposed in each area, and the details are not repeated here. Furthermore, since a high-level signal (VGH) and a low-level signal (VGL) are required to be input in working processes of the scan driver circuit 41 and the light-emitting control driver circuit 42, the scan driver circuit 41 and the light-emitting control driver circuit 42 are alternately disposed, and the scan driver circuit 41 and the light-emitting control driver circuit 42 may be disposed to share a high-level signal trace and a low-level signal trace, so that a number of signal traces is reduced, and the simple wiring process of the display panel is ensured.

Figure 18:
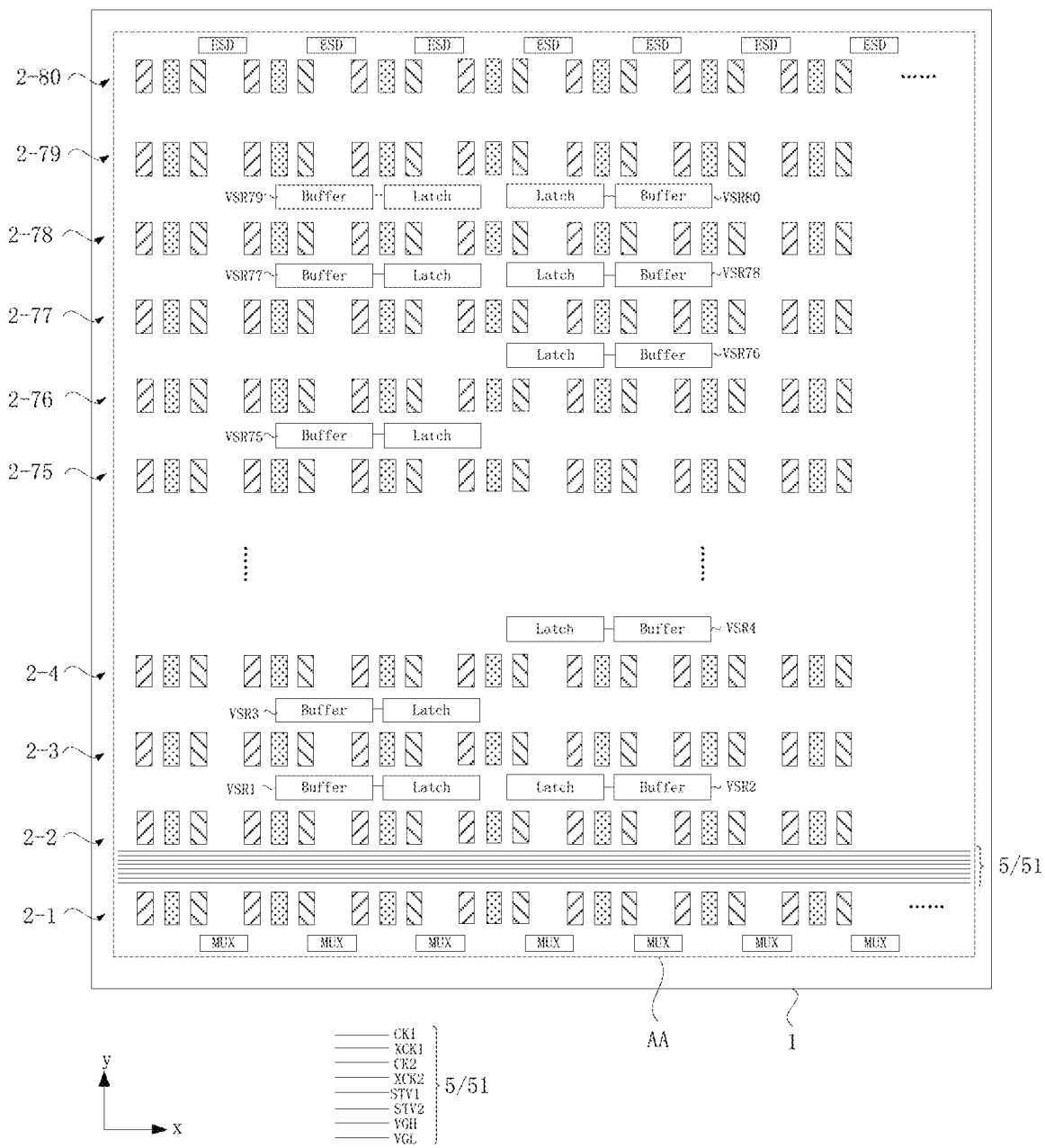
FIG. 18 is a schematic structural diagram of the display panel shown in FIG. 17 in an area Q2.
Figure 19:
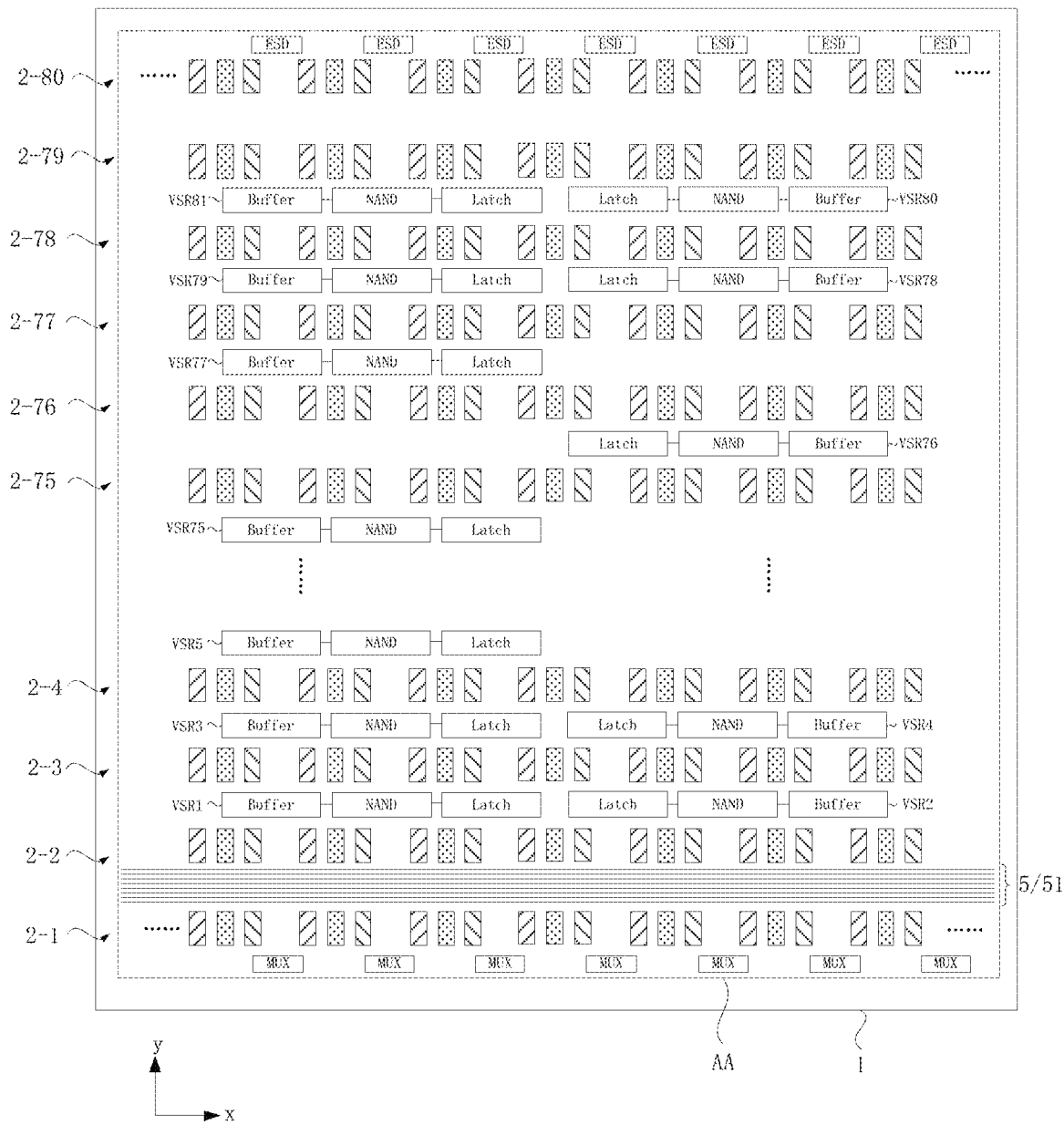
FIG. 19 is a schematic structural diagram of the display panel shown in FIG. 17 in an area Q3.

FIG. 18 is a schematic structural diagram of the display panel shown in FIG. 17 in an area Q2, FIG. 18 shows a specific setting manner of an area where the light-emitting control driver circuit 42 is located; FIG. 19 is a schematic structural diagram of the display panel shown in FIG. 17 in an area Q3, FIG. 19 shows a specific setting manner of an area where the scan driver circuit 41 is located. Referring to FIG. 18 and FIG. 19, the display panel further includes at least one driver circuit signal line group 5, and the at least one driver circuit signal line group 5 is configured to provide a drive signal to the driver circuit, and the at least one driver circuit signal line group 5 extends along the first direction x.

In the related art, the driver circuit signal line group is usually disposed on a left frame and a right frame and extends along the second direction y, and a signal terminal electrically connected to a driver chip is electrically connected to each driver circuit signal line in a diagonal line manner, so that drive signals are provided for each-stage shift register circuit. According to this scheme, a width of the left frame and a width of the right frame are increased, a degree of freedom of arrangement of the signal terminal is relatively small due to the connection manner of the diagonal line, and a size of the signal terminal and a distance between adjacent signal terminals need to be considered.

According to this embodiment of the present disclosure, the driver circuit signal line group 5 extends along the first direction x, on one hand, no frame on the left and right sides may be achieved, on the other hand, a wiring in the display area is facilitated, so that signal lines in the drive signal line group are electrically connected to the driver circuits, and the signal lines in the drive signal line group are electrically connected to the signal terminal in a straight pull line manner, whereby the setting freedom degree of the signal terminal is increased.

With continued reference to FIGS. 18 and 19, at least one group of light-emitting element row group is provided with the driver circuit signal line group 5; each of at least two groups of light-emitting element row groups is provided with two stages of shift register circuits (VSRs) disposed in cascade; and the same light-emitting element row group includes two light-emitting element rows which are disposed adjacent to each other along the second direction y.

Furthermore, in this embodiment, the driver circuit signal line group 5 is disposed in the light-emitting element row group, so that the lower frame of the display panel may be avoided from being increased.

The driver circuit signal line group 5 occupies at least one light-emitting element row group, so that a number of the light-emitting element row groups used for disposing the shift register circuit VSR is reduced by at least one, and thus each of the at least two light-emitting element row groups is provided with the two stages of shift register circuits (VSRs) disposed in cascade, so that the shift register circuit may be disposed in the light-emitting element row 2, the narrow frame or even no frame design of the display panel is achieved, and the screen-to-body ratio of the display panel is increased.

FIGS. 18 and 19 are illustrated by using an example in which a group of light-emitting element row group is provided with the driver circuit signal line group 5. Referring to FIGS. 18 and 19, the display panel has 80 light-emitting element rows (2-1 to 2-80), and thus, a number of the light-emitting element row groups is 79. The driver circuit signal line group is disposed between the light-emitting element row 2-1 and the light-emitting element row 2-2, and the shift register circuit is not disposed between the light-emitting element row 2-79 and the light-emitting element row 2-80, so that a number of the light-emitting element row groups of the shift register circuit may be disposed to be 77. As such, for 80 light-emitting control shift register circuits, it is required that each of at least three light-emitting element row groups is provided with two shift register circuits disposed in cascade (referring to FIG. 18), and for 81 scan shift register circuits, it is required that at least four light-emitting element row groups are provided with the two shift register circuits disposed in cascade (referring to FIG. 19).

In general, the number of the light-emitting element row groups provided with the two shift register circuits disposed in cascade is increased by one every time the number of the light-emitting element row groups used for disposing the shift register circuits is reduced by one, and this is not explained too much later.

Referring to FIGS. 18 and 19, the at least one driver circuit signal line group 5 includes a first driver circuit signal line group 51; and the first driver circuit signal line group 51 is configured to provide a signal for the driver circuit in a test stage and a display stage. When the display panel only includes one driver circuit signal line group (namely, the first driver circuit signal line group), the first driver circuit signal line group is configured to provide a signal for the driver circuit in the test stage so as to complete the test of the display panel, and is further configured to provide a signal for the driver circuit in the display stage so as to complete the normal display of the display panel. It should be understood that when the display panel includes only one group of driver circuit signal line group, the driver circuit signal line group includes both a signal line providing a drive signal for the scan driver circuit and a signal line providing a drive signal for the light-emitting control driver circuit.

Referring to FIG. 18, the driver circuit signal line group 5 includes a first clock signal line CK1, a second clock signal line XCK1, a third clock signal line CK2, a fourth clock signal line XCK2, a first enable signal line STV1, a second enable signal line STV2, a first level signal line VGH, and a second level signal line VGL; the driver circuit includes a scan driver circuit and a light-emitting control driver circuit; the first clock signal line CK1 is configured to provide a clock signal for the scan driver circuit, and the second clock signal line XCK1 is configured to provide a clock signal for the scan driver circuit; and the first enable signal line STV1 is configured to provide an initial starting signal for the scan driver circuit; the third clock signal line CK2 is configured to provide a clock signal for the light-emitting control driver circuit, and the fourth clock signal line XCK2 is configured to provide a clock signal for the light-emitting control driver circuit; and the second enable signal line STV2 is configured to provide an initial starting signal for the light-emitting control driver circuit; and the first level signal line VGH is configured to provide a first level signal for the scan driver circuit and the light-emitting control driver circuit, and the second level signal line VGL is configured to provide a second level signal for the scan driver circuit and the light-emitting control driver circuit.

The first enable signal line is configured to provide an initial starting signal for a first-stage scan shift register circuit in the scan driver circuit so as to trigger the first-stage scan shift register circuit to work, and a subsequent scan shift register circuit receives an output signal of a previous-stage scan shift register circuit to serve as a trigger signal of the subsequent scan shift register circuit, so that the cascade connection is achieved. In a similar way, the second enable signal line is configured to provide an initial starting signal for a first-stage light-emitting control shift register circuit in the light-emitting control driver circuit so as to trigger the first-stage light-emitting control shift register circuit to work, and a subsequent light-emitting control shift register circuit receives an output signal of a previous-stage light-emitting control shift register circuit to serve as a trigger signal of the subsequent light-emitting control shift register circuit, so that the cascade connection is achieved.

It should be noted that the signal lines included in the driver circuit signal line group described above are only schematic and are not limiting, and the signal lines in the driver circuit signal line group may be correspondingly disposed according to the structure of the shift register circuit.

Figure 20:
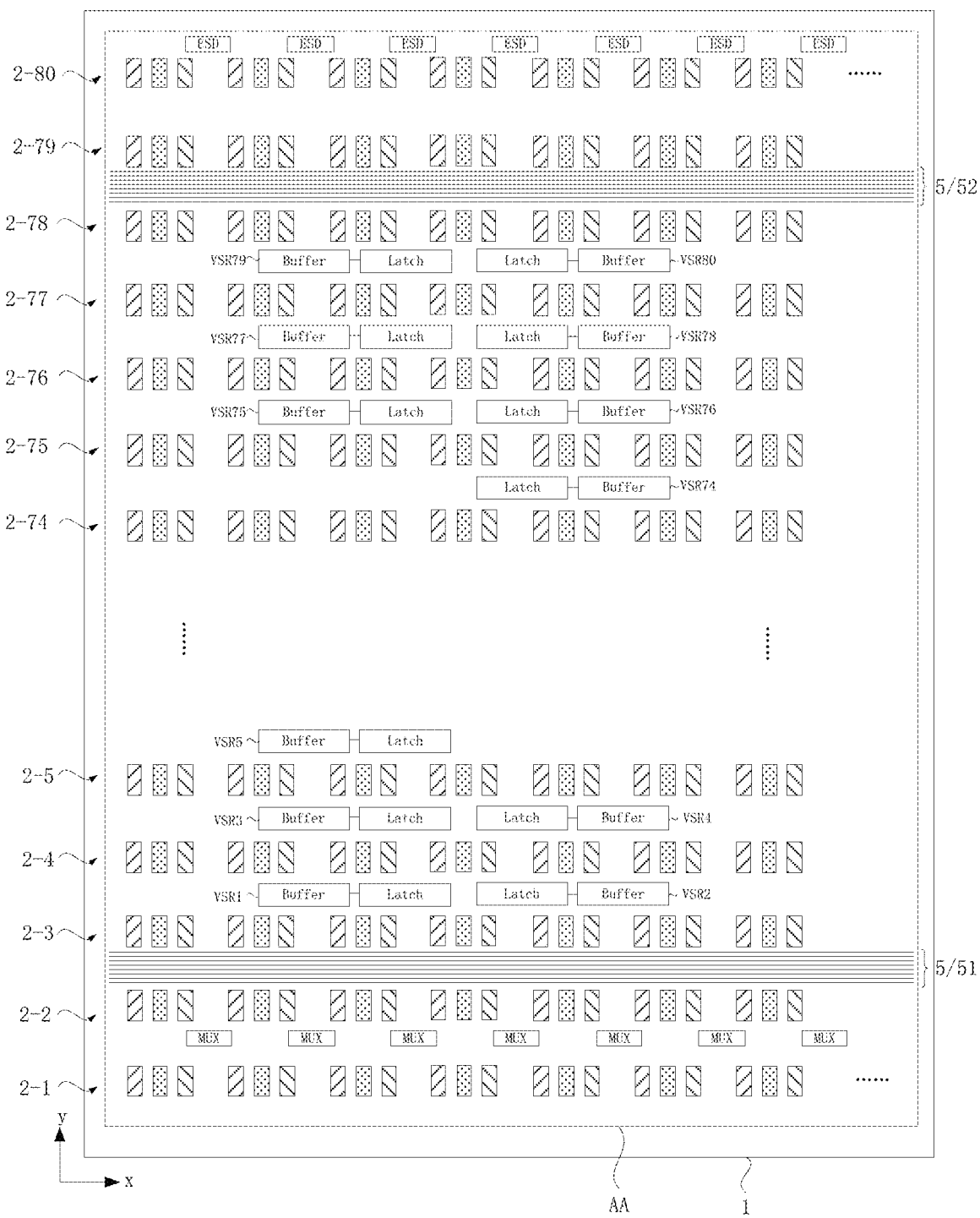
FIG. 20 is another schematic structural diagram of the display panel shown in FIG. 17 in an area Q2.
Figure 21:
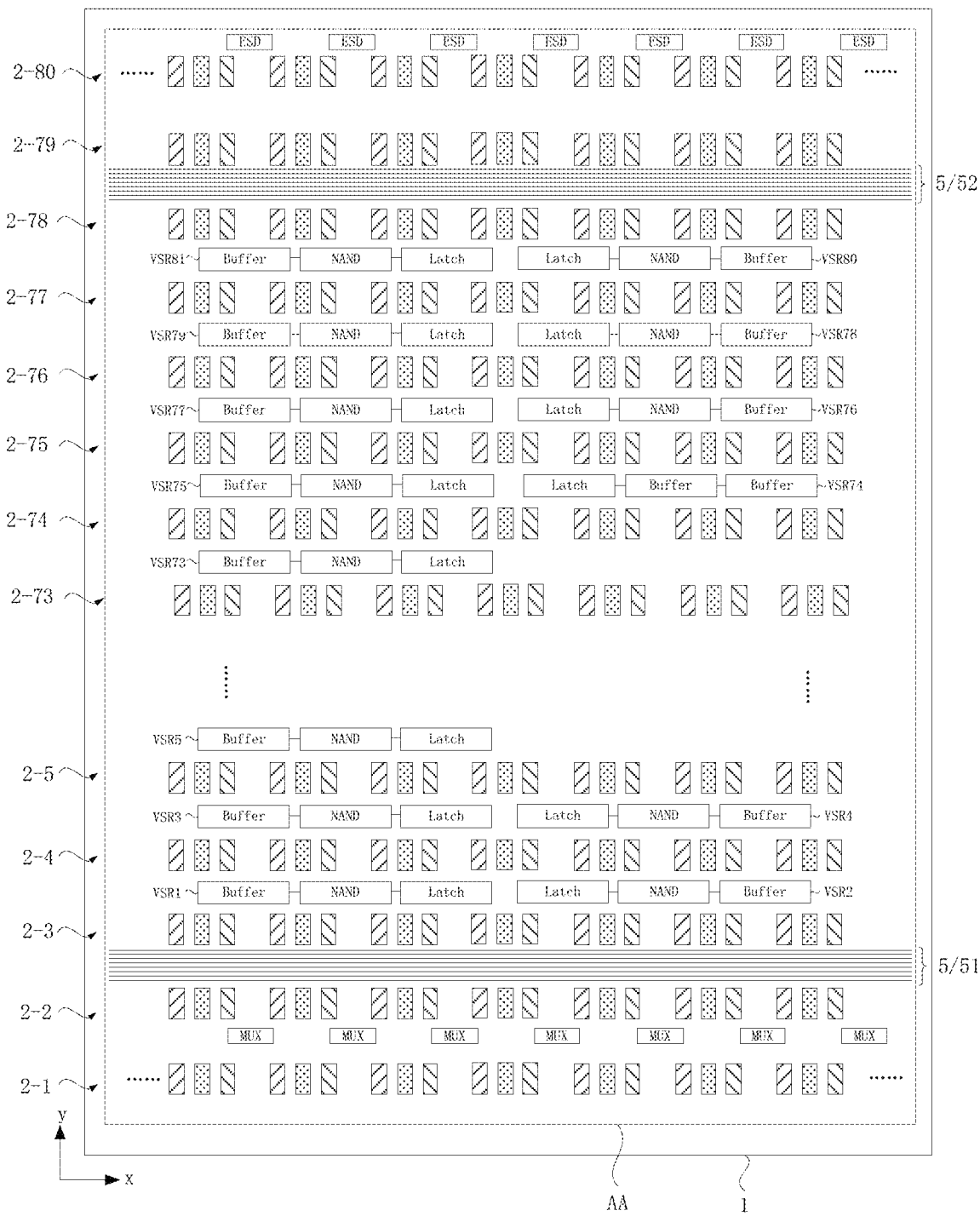
FIG. 21 is another schematic structural diagram of the display panel shown in FIG. 17 in an area Q3.

FIG. 20 is another schematic structural diagram of the display panel shown in FIG. 17 in an area Q2 FIG. 20 shows a specific setting manner of an area where another light-emitting control driver circuit 42 is located; FIG. 21 is another schematic structural diagram of the display panel shown in FIG. 17 in an area Q3; FIG. 21 shows a specific setting manner of an area where another scan driver circuit 41 is located. Referring to FIG. 20 and FIG. 21, in an embodiment, the at least one driver circuit signal line group includes a first driver circuit signal line group 51 and a second driver circuit signal line group 52; and the first driver circuit signal line group 51 and the second driver circuit signal line group 52 are located in different light-emitting element row groups; each of at least three light-emitting element row groups is provided with two shift register circuits (VSRs) disposed in cascade; and the first driver circuit signal line group 51 is configured to provide a signal for the driver circuit in a display stage, and the second driver circuit signal line group 52 is configured to provide a signal for the driver circuit in a test stage.

According to some embodiments of the present disclosure, two driver circuit signal line groups, namely the first driver circuit signal line group 51 and the second driver circuit signal line group 52, are provided, the first driver circuit signal line group 51 is configured to provide the signal for the driver circuit in the display stage, and the second driver circuit signal line group 52 is configured to provide the signal for the driver circuit in the test stage, so that a control manner is simple and flexible. It should be understood that the first driver circuit signal line group 51 and the second driver circuit signal line group 52 each include a signal line that provides a drive signal for the scan driver circuit and a signal line that provides a drive signal for the light-emitting control driver circuit. Since the number of driver circuit signal line groups is increased, the number of light-emitting element row groups that may be used for disposing the shift register circuits is decreased, and thus the number of light-emitting element row groups provided with the two stages of shift register circuits disposed in cascade is increased, see the description above for details.

It should be noted that the setting positions of the driver circuit signal line groups in FIGS. 18 to 21 are only illustrative and are not limiting, and in other embodiments, the driver circuit signal line groups may also be disposed in the light-emitting element row groups in the center of the display area.

Figure 22:
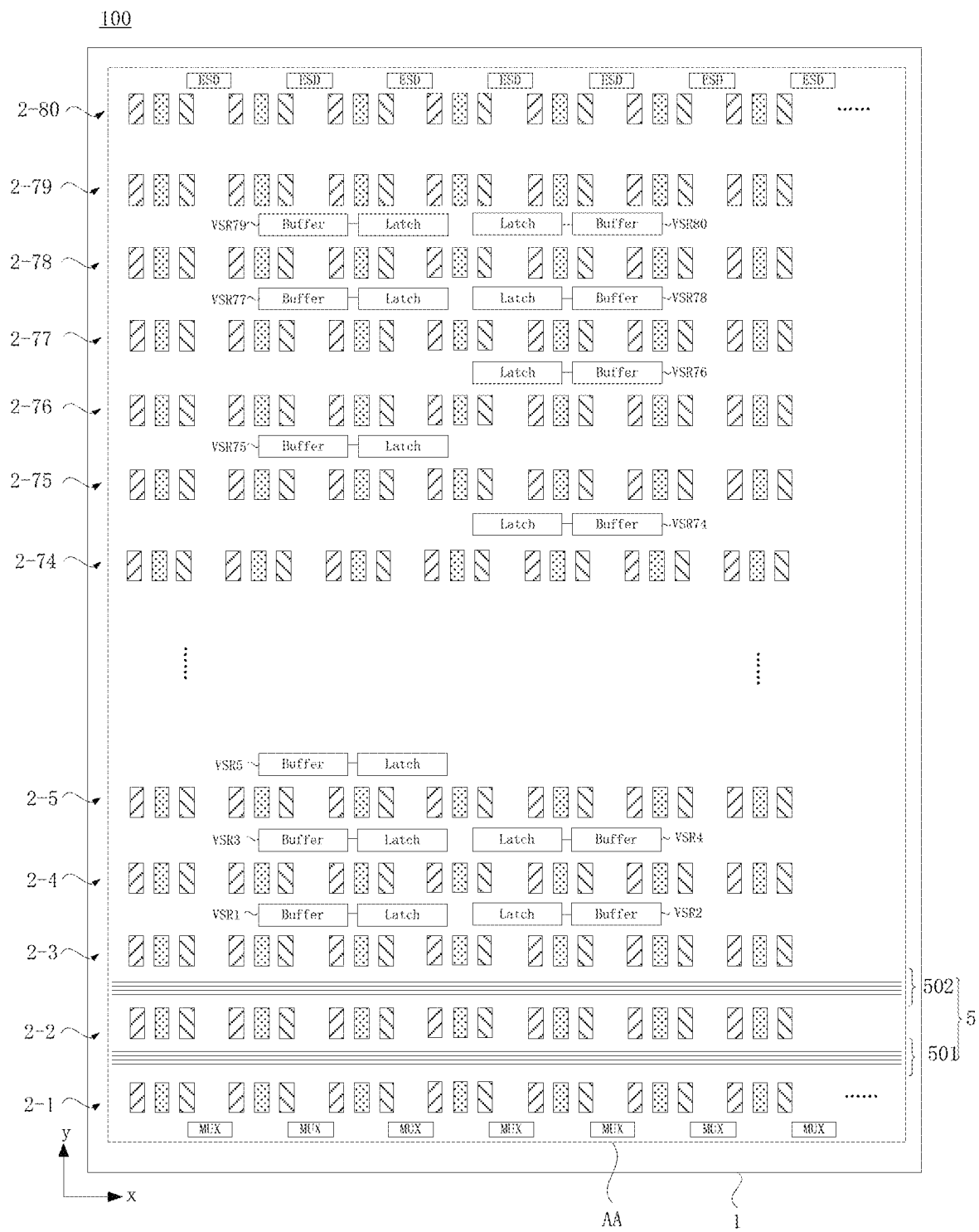
FIG. 22 is another schematic structural diagram of the display panel shown in FIG. 17 in an area Q2.

FIG. 22 is another schematic structural diagram of the display panel shown in FIG. 17 in an area Q2; FIG. 22 shows an example of an area where the light-emitting control driver circuit 42 is located, in which the setting manner of the driver circuit signal line groups is improved, and driver signal line groups in the remaining areas are the same as that of this area. Referring to FIG. 22, in an embodiment, the driver circuit signal line group 5 at least includes a first signal line group subsection 501 and a second signal line group subsection 502; the driver circuit includes a scan driver circuit and a light-emitting control driver circuit; the first signal line group subsection 501 is configured to provide a drive signal for the scan driver circuit, and the second signal line group subsection 502 is configured to provide a drive signal for the light-emitting control driver circuit; at least one group of light-emitting element row group are provided with the first signal line group subsection 501; at least one light-emitting element row group are provided with the second signal line group subsection 502, and the second signal line group subsection 502 and the first signal line group subsection 501 are located in different light-emitting element row groups; and each of at least three light-emitting element row groups is provided with two shift register circuits (VSRs) which are disposed in cascade; where the same light-emitting element row group includes two light-emitting element rows which are disposed adjacent to each other along the second direction y.

Since the signal lines in the driver circuit signal line group 5 have a certain line width and spacing, when a reserved space between two adjacent light-emitting element rows is not enough to accommodate the driver circuit signal line group 5, the driver circuit signal line group 5 may be divided into the first signal line group subsection 501 configured to provide the drive signal for the scan driver circuit, and the second signal line group subsection 501 configured to provide the drive signal for the light-emitting control driver circuit, and the first signal line group subsection 501 and the second signal line group subsection 502 are disposed in different light-emitting element row groups, so that the process difficulty is reduced, adverse effects caused by line width and line spacing of compressed signal lines are avoided, and thus the product yield is improved. Correspondingly, the first signal line group subsection 501 may include a first clock signal line CK1, a second clock signal line XCK1, a first enable signal line STV1, a first level signal line VGH, and a second level signal line VGL; the second signal line group subsection 502 may include a third clock signal line CK2, a fourth clock signal line XCK2, and a second enable signal line STV2. Or, the first signal line group section 501 may include the first clock signal line CK1, the second clock signal line XCK1, and the first enable signal line STV1; the second signal line group section 502 may include the third clock signal line CK2, the fourth clock signal line XCK2, the second enable signal line STV2, the first level signal line VGH, and the second level signal line VGL.

It should be noted that the splitting of the driver circuit signal line group 5 is not limited thereto, and in other embodiments, in an embodiment, one group of driver circuit signal line group 5 is located in at least two light-emitting element row groups; and the same light-emitting element row group includes two light-emitting element rows which are disposed adjacent to each other along the second direction y.

In an embodiment, one group of driver circuit signal line group may be divided into two parts according to other manners and disposed in two groups of light-emitting element row groups, one light-emitting element row group only includes the first signal line group subsection described above, and another light-emitting element row group only includes the second signal line group subsection described above. For example, it may be that the first clock signal line CK1, the second clock signal line XCK1, the first enable signal line STV1, the third clock signal line CK2, the fourth clock signal line XCK2, and the second enable signal line STV2 are located in one light-emitting element row group; the first level signal line VGH and the second level signal line VGL are located in another light-emitting element row group. Moreover, one group of drive signal line group may be disposed in three or more groups of light-emitting element row groups, even one signal line is disposed in each light-emitting element row group, which is not limited in the embodiments of the present disclosure.

Figure 23:
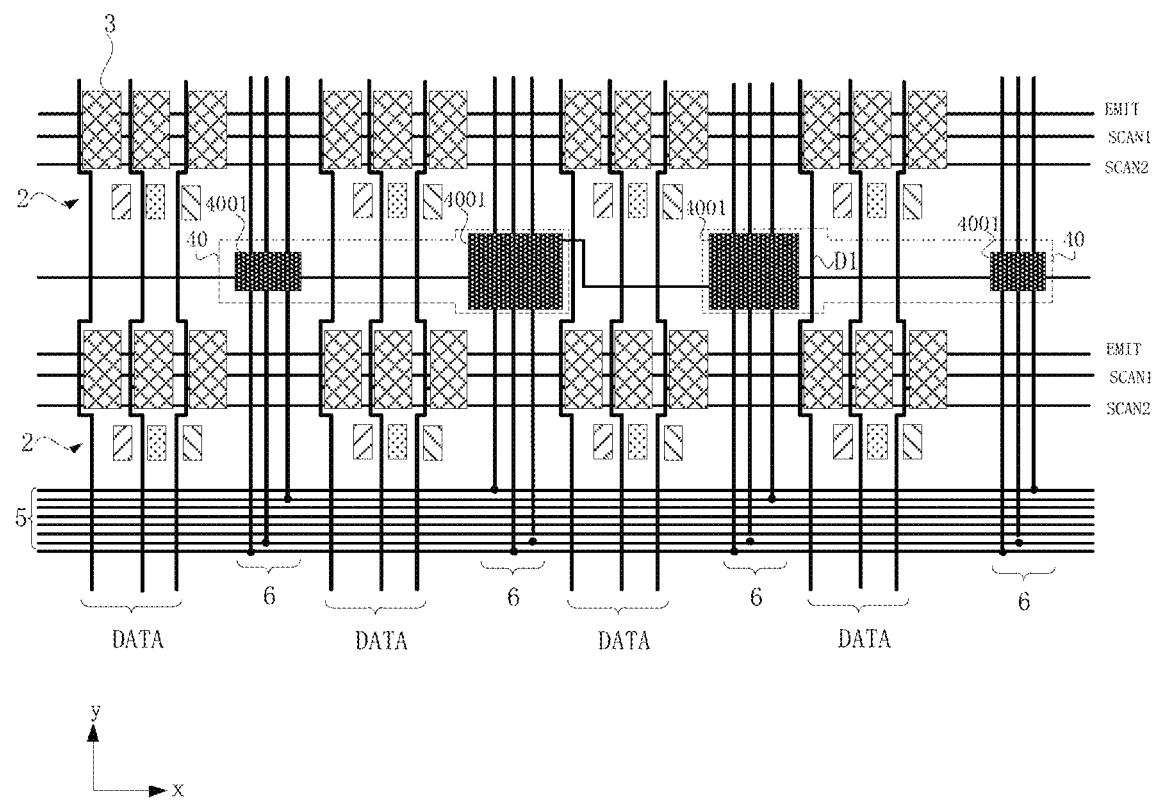
FIG. 23 is a schematic diagram of a partial structure of a display panel provided in an embodiment of the present disclosure.

FIG. 23 is a schematic diagram of a partial structure of a display panel according to another embodiment of the present disclosure. Referring to FIG. 23, the display panel further includes multiple data lines DATA and multiple scan lines (SCAN1 and SCAN2) which are located on a side of the base substrate and located in the display area, the multiple data lines extend along the second direction y, and the multiple data lines are arranged along the first direction x, and the multiple scan lines extend along the first direction x and are arranged along the second direction y.

As illustrated in FIG. 23, the scan line includes a first scan line SCAN1 and a second scan line SCAN2, and the scan lines extend along the first direction x and are configured to provide a scan signal for a group of pixel circuits 3 arranged along the first direction x. The data lines DATA extend as a whole along the second direction y and are configured to provide a data signal for at least one pixel circuit in a column of pixel circuits 3 arranged along the second direction y. Moreover, as shown in FIG. 23, the display panel further includes multiple light-emitting control lines EMIT located on a side of the base substrate and located in the display area, the multiple light-emitting control lines EMIT extend along the first direction x and are arranged along the second direction y, and the multiple light-emitting control lines EMIT are configured to provide a light-emitting control signal for a row of pixel circuits 3 arranged along the first direction x. Based on the cascade connection of the shift register circuits in the driver circuit, the pixel circuit may be scanned line by line, whereby the light-emitting elements emit light line by line, and the display of one-frame picture is achieved.

With continued reference to FIG. 23, the display panel further includes driver signal transmission traces 6, and the driver signal transmission traces 6 are electrically connected to the driver circuit signal line group 5 and the driver circuit 4, respectively; and the driver signal transmission traces 6 extend along the second direction y. In an embodiment, the driver signal transmission traces 6 are electrically connected to each-stage shift register circuit 40 in the driver circuit signal line group 5 and the driver circuit 4, respectively. As can be seen from FIG. 23, since the driver circuit signal line group 5 extends along the first direction x, the driver signal transmission traces 6 connecting the driver circuit signal line group 5 and the shift register circuit 40 may extend along the second direction y in a straight pull line manner, and the simple wiring manner of the driver signal transmission traces 6 is ensured.

With continued reference to FIG. 23, the shift register circuit 40 includes at least two shift register circuit modules 4001, and two adjacent shift register circuit modules 4001 are connected through a trace; each of the two shift register circuit modules 4001 is located among four light-emitting elements which are disposed adjacent to each other in a same light-emitting element row group, and the same light-emitting element row group includes two light-emitting element rows which are disposed adjacent to each other along the second direction y.

For the scan shift register circuit, the shift register circuit module may refer to the first latch module, the logic module and the first buffer module; and for the light-emitting control shift register circuit, the shift register circuit module may refer to the second latch module and the second buffer module.

The four shift register circuit modules 4001 in FIG. 23 may be a buffer module of an i-th shift register circuit, a latch module of the i-th shift register circuit, a latch module of an (i+1)-th shift register circuit and a buffer module of the (i+1)-th shift register circuit in sequence from left to right, as shown in FIG. 23, and the latch module and the buffer module of a same-stage shift register circuit 40 are electrically connected through the trace, and the latch modules of adjacent-stage shift register circuits are electrically connected so as to achieve the cascade connection.

As can be seen from FIG. 23, the two shift register circuit modules 4001 is located among the four light-emitting elements which are disposed adjacent to each other in the same light-emitting element row group, so that projections of the shift register circuit module 4001 and the pixel circuit 3 along the second direction y being overlapped may be avoided, and further, the driver signal transmission trace 6 may be disposed in the space among the four light-emitting elements which are disposed adjacent to each other, and the driver signal transmission trace 6 is prevented from conflicting with the data line DATA. When the multiple light-emitting elements 20 and the multiple pixel circuits 3 are arranged in a pixel cluster, that is, within the pixel cluster, a pitch between the light-emitting elements 20 and the pixel circuits 3 is relatively small, and a pitch between the pixel clusters is relatively large, the shift register circuit module 4001 may be located between adjacent 4 pixel clusters.

Moreover, as can be seen from FIG. 23, a number of the driver signal transmission traces 6 corresponding to each shift register module 4001 is relatively small, and therefore, in the embodiments of the present disclosure, the shift register circuit 40 is divided into at least two shift register modules 4001, and the shift register circuit module 4001 is located between the four light-emitting elements which are disposed adjacent to each other in the same light-emitting element row group, so that the driver signal transmission traces 6 of the shift register circuit 40 may be dispersed in different spaces, which is beneficial to reducing the wiring difficulty.

As can be seen from FIGS. 23, 17, 18 and 19, the scan driver circuits 41 and the light-emitting control driver circuits 42 are alternately disposed along the first direction x, and the scan shift register circuit 41 and the light-emitting shift register circuit 42 are divided into several shift register modules (such as the latch module and the buffer module described above), so that the modules are dispersed between adjacent light-emitting element rows, thereby making a number of all data lines and a number of jumper lines of the shift register circuit as consistent as possible along the first direction x and the second direction y, making parasitic capacitances of the data lines as consistent as possible, and being beneficial to ensuring the display uniformity.

With continued reference to FIG. 23, each of the multiple data lines DATA includes a winding part D1, the winding part D1 is adjacent to a shift register circuit module 4001, and the winding part D1 is not overlapped with the shift register circuit module 4001 along a direction perpendicular to the base substrate.

As shown in FIG. 23, the data lines overlapped with the protections of the shift register circuits 40 along the first direction x have a winding design, so as to avoid a short circuit and reduce the mutual influence with the shift register circuits 40. In addition, as shown in FIG. 23, winding lengths of the data lines are substantially the same, so that trace resistances of the data lines are substantially the same, and thus the display uniformity is ensured.

Referring to FIGS. 18 and 19, the display panel further includes a multiplexing circuit mux disposed in the display area AA, and a setting area of the multiplexing circuit mux is not overlapped with any one of a setting area of the light-emitting elements, a setting area of the pixel circuits, or a setting area of the driver circuit. One multiplexing circuit mux is electrically connected to the multiple data lines DATA and is configured to transmit data signals to the each data lines in a time-sharing mode so as to solve a problem that a number of the data lines is not balanced with a number of pins of the driver chip. In this embodiment, a width of the lower frame is reduced by disposing the multiplexing circuit mux in the display area.

Referring to FIG. 20 and FIG. 21, further in an embodiment, the multiplexing circuit mux is disposed between two adjacent light-emitting element rows 2. With this arrangement, the structure originally disposed on the lower frame may be further offset toward the display area so as to reduce the lower frame.

Referring to FIG. 16, in an embodiment, the display panel 100 further includes a signal terminal 7. The signal terminal 7 includes at least one of a data signal terminal, a power signal terminal, a clock signal terminal, or an electrostatic shield terminal. The signal terminal 7 is located in the display area AA, and a setting area of the signal terminal 7 does not overlap with any one of a setting area of the multiple light-emitting elements, a setting area of the multiple pixel circuits or a setting area of the driver circuit. In this embodiment, the display panel can be achieved without the lower frame by disposing the signal terminal 7 in the display area.

Referring to FIG. 16, the display panel 100 further includes an electrostatic shield trace 8 surrounding the display area AA. The electrostatic shield trace 8 is electrically connected to an electrostatic shield terminal in the signal terminal 7 so as to shield an external static electricity and prevent the static electricity from damaging the circuit structure inside the display area.

Referring to FIG. 16, the display panel 100 further includes an electrostatic protection circuit ESD disposed in the display area AA. The electrostatic protection circuit ESD may be disposed at the edge of the display area, does not overlap with the setting area of the multiple light-emitting elements, the setting area of the multiple pixel circuits and the setting area of the driver circuit, and also plays a role of shielding static electricity.

Figure 24:
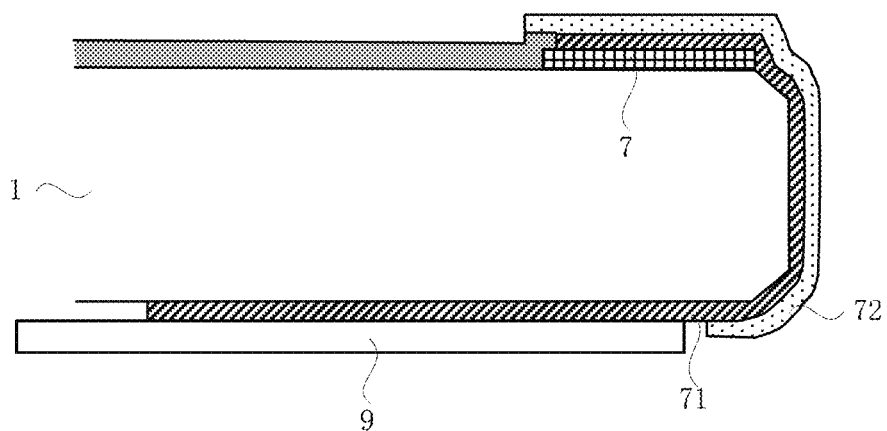
FIG. 24 is a schematic diagram of a partial structure of another display panel provided in an embodiment of the present disclosure.

FIG. 24 is a schematic diagram of a partial structure of a display panel according to another embodiment of the present disclosure. Referring to FIG. 24, the display panel further includes a flexible circuit board 9; the flexible circuit board 9 is disposed on a non-light-exiting side of the display panel. The flexible circuit board 9 is electrically connected to the signal terminal 7 through a conductive structure 71. The conductive structure 71 is located on a side face of the display panel. With this arrangement, the lower frame of the display panel may be reduced and the screen-to-body ratio of the display panel may be increased. The conductive structure 71 may be, for example, a conductive silver paste, and an upper surface of the conductive silver paste may be covered with a protective ink 72.

Through the above technical schemes, the display panel provided in the embodiments of the present disclosure may realize a narrow frame or even no frame, and thus may be used for splicing display, that is, the multiple display panels spliced into a larger-sized display panel for display.

Figure 25:
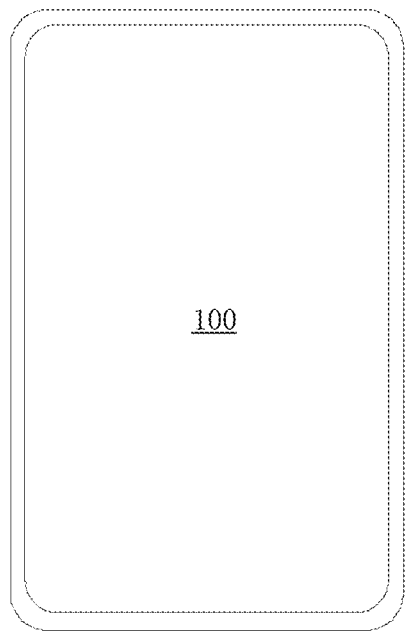
FIG. 25 is a schematic structural diagram of a display device provided in an embodiment of the present disclosure.

Based on the same inventive concept, an embodiment of the present disclosure further provides a display device, and FIG. 25 is a schematic structural diagram of a display device provided in an embodiment of the present disclosure, the display device 200 includes the display panel 100 provided in any one of the embodiments described above, and thus has the same beneficial effects as the display panel described above, and the same points may be referred to the description of the embodiments of the display panel described above, and the details are not repeated here. The display device provided in the embodiments of the present disclosure may be a mobile phone as shown in FIG. 25, and may also be any electronic product with a display function, including but not limited to following categories: a television, a notebook computer, a desktop display, a tablet computer, a digital camera, an intelligent bracelet, intelligent glasses, a vehicle-mounted display, medical equipment, industrial control equipment, a touch interaction terminal and the like, which is not particularly limited in the embodiments of the present disclosure.

It is to be noted that the above-mentioned contents are only the exemplary embodiments of the present disclosure and the technical principles applied thereto. It is to be understood by those skilled in the art that the present disclosure is not limited to the particular embodiments described herein, and that various variations, rearrangements and substitutions may be made without departing from the scope of protection of the present disclosure. Therefore, although the present disclosure has been described in detail with reference to the above embodiments, the present disclosure is not limited to the above embodiments, and may further include other equivalent embodiments without departing from the concept of the present disclosure, and the scope of the present disclosure is defined by the appended claims.

What is claimed is:

1. A display panel, comprising a display area;
wherein the display panel further comprises:
a light-emitting element, wherein the light-emitting element is located in the display area;
a pixel circuit, wherein the pixel circuit is located in the display area and the pixel circuit is configured to drive the light-emitting element;
a driver circuit, wherein the driver circuit is located in the display area and the driver circuit is configured to provide a drive signal to the pixel circuit; and
pixel circuit rows, wherein at least one of the pixel circuit rows comprises a plurality of pixel circuits arranged along a first direction, the pixel circuit rows are arranged along a second direction, the first direction and the second direction intersect;

wherein the driver circuit comprises a plurality of stages of shift register circuits cascaded and at least one stage of shift register circuit is located between adjacent pixel circuit rows;

wherein the display panel further comprises a multiplexing circuit disposed in the display area, a signal terminal disposed in the display area, and an electrostatic protection circuit disposed in the display area;

wherein at least one of the following is satisfied:

along the second direction, a plurality of pixel circuit rows of the pixel circuit rows, a plurality of light-emitting elements or a plurality of stages of shift register circuits are disposed between the signal terminal and the electrostatic protection circuit;

or along the second direction, a plurality of pixel circuit rows of the pixel circuit rows, a plurality of light-emitting elements or a plurality of stages of shift register circuits are disposed between the multiplexing circuit and the electrostatic protection circuit.

2. The display panel of claim 1, wherein
the display panel comprises a plurality of data lines and a data line of the plurality of data lines is configured to provide a data signal for the pixel circuit; and
the multiplexing circuit is electrically connected to the plurality of data lines.

3. The display panel of claim 1, wherein
the multiplexing circuit and the pixel circuit do not overlap.

4. A display panel, comprising a display area;
wherein the display panel further comprises:
a light-emitting element, wherein the light-emitting element is located in the display area;
a pixel circuit, wherein the pixel circuit is located in the display area and the pixel circuit is configured to drive the light-emitting element;
a driver circuit, wherein the driver circuit is located in the display area and the driver circuit is configured to provide a drive signal to the pixel circuit; and
pixel circuit rows, wherein at least one of the pixel circuit rows comprises a plurality of pixel circuits arranged along a first direction, the pixel circuit rows are arranged along a second direction, the first direction and the second direction intersect;
wherein the driver circuit comprises a plurality of stages of shift register circuits cascaded and at least one stage of shift register circuit is located between adjacent pixel circuit rows;
wherein the display panel further comprises a multiplexing circuit disposed in the display area;
wherein the multiplexing circuit and the driver circuit do not overlap.

5. The display panel of claim 1, wherein
the multiplexing circuit and the light-emitting element do not overlap.

6. The display panel of claim 1, wherein
at least one multiplexing circuit is located between adjacent pixel circuit rows or adjacent light-emitting element rows.

7. The display panel of claim 1, wherein
the signal terminal comprises at least one of a data signal terminal, a power signal terminal, a clock signal terminal, or an electrostatic shield terminal.

8. The display panel of claim 7, wherein at least one of the following is satisfied:
the display panel comprises a data signal terminal and the data signal terminal is connected to a data line in the display panel;
the display panel comprises a power signal terminal, and the power signal terminal is connected to a power signal line in the display panel;
the display panel comprises a clock signal terminal and the clock signal terminal is connected to a clock signal line in the display panel; or,
the display panel comprises an electrostatic shield terminal, and the electrostatic shield terminal is connected to an electrostatic shield trace in the display panel.

9. The display panel of claim 8, wherein
the display panel comprises an electrostatic shield trace and the electrostatic shield trace is connected to the electrostatic shield terminal;
the electrostatic shield trace is located surrounding the display area.

10. The display panel of claim 7, wherein
the display panel comprises a flexible circuit board and the flexible circuit board is disposed on a non-light-exiting side of the display panel; and
the flexible circuit board is electrically connected to the signal terminal through a conductive structure.

11. The display panel of claim 10, wherein
the conductive structure is located on a side face of the display panel.

12. The display panel of claim 11, wherein
the conductive structure comprises a conductive silver paste and an upper surface of the conductive silver paste is covered with a protective ink.

13. The display panel of claim 7, wherein
the signal terminal does not overlap with the pixel circuit.

14. The display panel of claim 7, wherein
the signal terminal does not overlap with the driver circuit.

15. The display panel of claim 7, wherein
the signal terminal does not overlap with the light-emitting element.

16. The display panel of claim 1, wherein
the electrostatic protection circuit is disposed at an edge area of the display area.

17. The display panel of claim 16, wherein
the electrostatic protection circuit does not overlap with the pixel circuit.

18. The display panel of claim 16, wherein
the electrostatic protection circuit does not overlap with the driver circuit.

19. The display panel of claim 16, wherein
the electrostatic protection circuit does not overlap with the light-emitting element.

20. A display device comprising a display panel, wherein the display panel comprises a display area;
wherein the display panel further comprises:
a light-emitting element, wherein the light-emitting element is located in the display area;
a pixel circuit, wherein the pixel circuit is located in the display area and the pixel circuit is configured to drive the light-emitting element;
a driver circuit, wherein the driver circuit is located in the display area and the driver circuit is configured to provide a drive signal to the pixel circuit; and
pixel circuit rows, wherein at least one of the pixel circuit rows comprises a plurality of pixel circuits arranged along a first direction, the pixel circuit rows are arranged along a second direction, the first direction and the second direction intersect;

wherein the driver circuit comprises a plurality of stages of shift register circuits cascaded and at least one stage of shift register circuit is located between adjacent pixel circuit rows;

wherein the display panel further comprises a multiplexing circuit disposed in the display area, a signal terminal disposed in the display area, and an electrostatic protection circuit disposed in the display area;

wherein at least one of the following is satisfied:

along the second direction, a plurality of pixel circuit rows of the pixel circuit rows, a plurality of light-emitting elements or a plurality of stages of shift register circuits are disposed between the signal terminal and the electrostatic protection circuit;

or along the second direction, a plurality of pixel circuit rows of the pixel circuit rows, a plurality of light-emitting elements or a plurality of stages of shift register circuits are disposed between the multiplexing circuit and the electrostatic protection circuit.

* * * * *